United States Patent
Van Wyk et al.

(10) Patent No.: US 11,146,352 B2
(45) Date of Patent: Oct. 12, 2021

(54) MESSAGE CORRECTION AND DYNAMIC CORRECTION ADJUSTMENT FOR COMMUNICATION SYSTEMS

(71) Applicant: Itron Global SARL, Liberty Lake, WA (US)

(72) Inventors: Hartman Van Wyk, Puy-d'Arnac (FR); Gilles Picard, Thiais (FR)

(73) Assignee: Itron Global SARL, Liberty Lake, WA (US)

( * ) Notice: Subject to any disclaimer, the term of this patent is extended or adjusted under 35 U.S.C. 154(b) by 0 days.

(21) Appl. No.: 17/066,907

(22) Filed: Oct. 9, 2020

(65) Prior Publication Data

US 2021/0028880 A1    Jan. 28, 2021

Related U.S. Application Data

(63) Continuation of application No. 15/993,871, filed on May 31, 2018, now Pat. No. 10,833,799.

(51) Int. Cl.
    *H04L 1/00*      (2006.01)
    *H03M 13/05*      (2006.01)
    *H03M 13/29*      (2006.01)

(52) U.S. Cl.
    CPC ........... *H04L 1/0011* (2013.01); *H03M 13/05* (2013.01); *H03M 13/293* (2013.01); *H04L 1/0061* (2013.01)

(58) Field of Classification Search
    CPC .... H04L 1/0011; H04L 1/0061; H03M 13/05; H03M 13/293

(Continued)

(56) References Cited

U.S. PATENT DOCUMENTS

| 4,799,062 A | 1/1989 | Sanderford, Jr. et al. |
| 4,977,577 A | 12/1990 | Arthur et al. |

(Continued)

FOREIGN PATENT DOCUMENTS

| WO | 2003015452 A2 | 2/2003 |
| WO | 2003090411 A1 | 10/2003 |

(Continued)

OTHER PUBLICATIONS

"Technical Overview of Time Synchronized Mesh Protocol (TSMP)," Dust Networks, Document No. 025-0003-01, Jun. 20, 2006, 18 pages.

(Continued)

*Primary Examiner* — John J Tabone, Jr.
(74) *Attorney, Agent, or Firm* — Lee & Hayes, P.C.

(57) ABSTRACT

A method for sending communications with dynamic data correction to at least one receiving device includes dividing a message into one or more message blocks and determining corresponding redundancy blocks for the one or more message blocks, the redundancy blocks to be used by at least one of the receiving devices for message block detection or message block correction. The method further includes constructing a data packet including a header and a data payload including the one or more message blocks and the corresponding redundancy blocks. The construction of the data packet is such that it is processable by receiving devices that are configured to recognize and process the corresponding redundancy blocks and also processable by other receiving devices that cannot recognize the presence of the corresponding redundancy blocks. The method further includes sending the constructed data packet to the at least one receiving device.

22 Claims, 19 Drawing Sheets

(58) Field of Classification Search
USPC .............. 714/746, 748, 749, 750, 776, 821;
370/471, 473, 474; 375/135, 136, 224,
375/240.24
See application file for complete search history.

(56) References Cited

U.S. PATENT DOCUMENTS

| | | | |
|---|---|---|---|
| 4,998,102 A | 3/1991 | Wyler et al. | |
| 5,005,142 A | 4/1991 | Lipchak et al. | |
| 5,067,136 A | 11/1991 | Arthur et al. | |
| 5,095,493 A | 3/1992 | Arthur et al. | |
| 5,119,396 A | 6/1992 | Sanderford, Jr. | |
| 5,166,927 A | 11/1992 | Iida et al. | |
| 5,198,796 A | 3/1993 | Hessling, Jr. | |
| 5,265,120 A | 11/1993 | Sanderford, Jr. | |
| 5,310,075 A | 5/1994 | Wyler | |
| 5,311,541 A | 5/1994 | Sanderford, Jr. | |
| 5,377,222 A | 12/1994 | Sanderford, Jr. | |
| 5,377,232 A | 12/1994 | Davidov et al. | |
| 5,457,713 A | 10/1995 | Sanderford, Jr. et al. | |
| 5,486,805 A | 1/1996 | Mak | |
| 5,509,027 A | 4/1996 | Vook et al. | |
| 5,598,427 A | 1/1997 | Arthur et al. | |
| 5,604,768 A | 2/1997 | Fulton | |
| 5,626,755 A | 5/1997 | Keyser et al. | |
| 5,661,750 A | 8/1997 | Fulton | |
| 5,668,828 A | 9/1997 | Sanderford, Jr. et al. | |
| 5,696,441 A | 12/1997 | Mak et al. | |
| RE35,829 E | 6/1998 | Sanderford, Jr. | |
| 5,802,311 A | 9/1998 | Wronski | |
| 5,881,073 A * | 3/1999 | Wan .................... | H03M 13/35 714/786 |
| 5,907,491 A | 5/1999 | Canada et al. | |
| 5,907,559 A | 5/1999 | Shuman et al. | |
| 5,920,589 A | 7/1999 | Rouquette et al. | |
| 5,926,531 A | 7/1999 | Petite | |
| 5,933,072 A | 8/1999 | Kelley | |
| 5,953,368 A | 9/1999 | Sanderford et al. | |
| 5,987,058 A | 11/1999 | Sanderford et al. | |
| 6,028,522 A | 2/2000 | Petite | |
| 6,031,883 A | 2/2000 | Sanderford, Jr. et al. | |
| 6,044,062 A | 3/2000 | Brownrigg et al. | |
| 6,047,016 A | 4/2000 | Ramberg et al. | |
| 6,078,251 A | 6/2000 | Landt et al. | |
| 6,088,689 A | 7/2000 | Kohn et al. | |
| 6,100,816 A | 8/2000 | Moore | |
| 6,163,276 A | 12/2000 | Irving et al. | |
| 6,178,197 B1 | 1/2001 | Froelich et al. | |
| 6,181,258 B1 | 1/2001 | Summers et al. | |
| 6,195,018 B1 | 2/2001 | Ragle et al. | |
| 6,204,808 B1 | 3/2001 | Bloebaum et al. | |
| 6,218,953 B1 | 4/2001 | Petite | |
| 6,232,885 B1 | 5/2001 | Ridenour et al. | |
| 6,233,327 B1 | 5/2001 | Petite | |
| 6,246,677 B1 | 6/2001 | Nap et al. | |
| 6,249,516 B1 | 6/2001 | Brownrigg et al. | |
| 6,263,009 B1 | 7/2001 | Ramberg et al. | |
| 6,321,271 B1 | 11/2001 | Kodialam et al. | |
| 6,335,953 B1 | 1/2002 | Sanderford, Jr. et al. | |
| 6,349,094 B1 | 2/2002 | Vastano et al. | |
| 6,363,057 B1 | 3/2002 | Ardalan et al. | |
| 6,369,769 B1 | 4/2002 | Nap et al. | |
| 6,377,609 B1 | 4/2002 | Brennan, Jr. | |
| 6,396,839 B1 | 5/2002 | Ardalan et al. | |
| 6,424,270 B1 | 7/2002 | Ali | |
| 6,426,027 B1 | 7/2002 | Scarborough, III et al. | |
| 6,430,230 B1 * | 8/2002 | Cunningham ...... | H04L 25/4908 375/292 |
| 6,430,268 B1 | 8/2002 | Petite | |
| 6,437,692 B1 | 8/2002 | Petite et al. | |
| 6,452,986 B1 | 9/2002 | Luxford et al. | |
| 6,456,644 B1 | 9/2002 | Ramberg et al. | |
| 6,538,577 B1 | 3/2003 | Ehrke et al. | |
| 6,604,434 B1 | 8/2003 | Hamilton et al. | |
| 6,612,188 B2 | 9/2003 | Hamilton | |
| 6,617,879 B1 | 9/2003 | Chung | |
| 6,617,976 B2 | 9/2003 | Walden et al. | |
| 6,617,978 B2 | 9/2003 | Ridenour et al. | |
| 6,618,578 B1 | 9/2003 | Petite | |
| 6,626,048 B1 | 9/2003 | Dam Es et al. | |
| 6,628,764 B1 | 9/2003 | Petite | |
| 6,639,939 B1 | 10/2003 | Naden et al. | |
| 6,650,249 B2 | 11/2003 | Meyer et al. | |
| 6,657,552 B2 | 12/2003 | Belski et al. | |
| 6,671,586 B2 | 12/2003 | Davis et al. | |
| 6,700,902 B1 | 3/2004 | Meyer | |
| 6,704,301 B2 | 3/2004 | Chari et al. | |
| 6,734,663 B2 | 5/2004 | Fye et al. | |
| 6,735,178 B1 | 5/2004 | Srivastava et al. | |
| 6,747,557 B1 | 6/2004 | Petite et al. | |
| 6,747,981 B2 | 6/2004 | Ardalan et al. | |
| 6,763,013 B2 | 7/2004 | Kennedy | |
| 6,778,099 B1 | 8/2004 | Meyer et al. | |
| 6,784,806 B1 | 8/2004 | Lee, Jr. et al. | |
| 6,784,807 B2 | 8/2004 | Petite et al. | |
| 6,816,538 B2 | 11/2004 | Shuey et al. | |
| 6,836,108 B1 | 12/2004 | Balko et al. | |
| 6,836,737 B2 | 12/2004 | Petite et al. | |
| 6,842,460 B1 | 1/2005 | Olkkonen et al. | |
| 6,850,197 B2 | 2/2005 | Paun | |
| 6,859,186 B2 | 2/2005 | Lizalek et al. | |
| 6,862,498 B2 | 3/2005 | Davis et al. | |
| 6,867,707 B1 | 3/2005 | Kelley et al. | |
| 6,885,309 B1 | 4/2005 | Van Heteren | |
| 6,891,838 B1 | 5/2005 | Petite et al. | |
| 6,894,975 B1 | 5/2005 | Partyka | |
| 6,900,737 B1 | 5/2005 | Ardalan et al. | |
| 6,914,533 B2 | 7/2005 | Petite | |
| 6,914,893 B2 | 7/2005 | Petite | |
| 6,918,311 B2 | 7/2005 | Nathan | |
| 6,928,263 B2 | 8/2005 | Blake et al. | |
| 6,931,445 B2 | 8/2005 | Davis | |
| 6,940,396 B2 | 9/2005 | Hammond et al. | |
| 6,965,575 B2 | 11/2005 | Srikrishna et al. | |
| 6,972,555 B2 | 12/2005 | Balko et al. | |
| 6,982,651 B2 | 1/2006 | Fischer | |
| 7,012,546 B1 | 3/2006 | Zigdon et al. | |
| 7,020,701 B1 | 3/2006 | Gelvin et al. | |
| 7,031,945 B1 | 4/2006 | Donner | |
| 7,046,682 B2 | 5/2006 | Carpenter et al. | |
| 7,054,271 B2 | 5/2006 | Brownrigg et al. | |
| 7,062,227 B2 | 6/2006 | Chevalier et al. | |
| 7,065,045 B2 | 6/2006 | Jeffries et al. | |
| 7,103,511 B2 | 9/2006 | Petite | |
| 7,126,494 B2 | 10/2006 | Ardalan et al. | |
| 7,142,123 B1 | 11/2006 | Kates | |
| 7,234,000 B2 | 6/2007 | McEachern et al. | |
| 7,498,953 B2 | 3/2009 | Salser, Jr. et al. | |
| 7,583,202 B2 | 9/2009 | Robinson et al. | |
| 7,653,394 B2 | 1/2010 | McMillin | |
| 7,676,195 B2 | 3/2010 | Raitu et al. | |
| 7,802,015 B2 | 9/2010 | Cheifot et al. | |
| 7,840,178 B2 | 11/2010 | Hellman | |
| 7,843,834 B2 | 11/2010 | Picard | |
| 8,391,177 B2 | 3/2013 | Picard | |
| 8,787,210 B2 | 7/2014 | Picard | |
| 8,848,571 B2 | 9/2014 | Picard | |
| 2001/0046225 A1 | 11/2001 | Schwaller et al. | |
| 2002/0010641 A1 | 1/2002 | Stevens et al. | |
| 2002/0019725 A1 | 2/2002 | Petite | |
| 2002/0037716 A1 | 3/2002 | McKenna et al. | |
| 2002/0146985 A1 | 10/2002 | Naden | |
| 2002/0159385 A1 | 10/2002 | Susnow et al. | |
| 2002/0169643 A1 | 11/2002 | Petite et al. | |
| 2002/0186749 A1 | 12/2002 | Jones | |
| 2003/0033394 A1 | 2/2003 | Stine | |
| 2003/0037167 A1 | 2/2003 | Garcia-Luna-Aceves et al. | |
| 2003/0048199 A1 | 3/2003 | Zigdon et al. | |
| 2003/0063723 A1 | 4/2003 | Booth et al. | |
| 2003/0078029 A1 | 4/2003 | Petite | |
| 2003/0093484 A1 | 5/2003 | Petite | |
| 2003/0103486 A1 | 6/2003 | Salt et al. | |
| 2003/0179149 A1 | 9/2003 | Savage et al. | |
| 2004/0004555 A1 | 1/2004 | Martin | |

(56) References Cited

U.S. PATENT DOCUMENTS

| | | |
|---|---|---|
| 2004/0008663 A1 | 1/2004 | Srikrishna et al. |
| 2004/0040368 A1 | 3/2004 | Guckenberger et al. |
| 2004/0053639 A1 | 3/2004 | Petite et al. |
| 2004/0061623 A1 | 4/2004 | Mashhad et al. |
| 2004/0062224 A1 | 4/2004 | Brownrigg et al. |
| 2004/0085928 A1 | 5/2004 | Chari et al. |
| 2004/0088083 A1 | 5/2004 | Davis et al. |
| 2004/0131125 A1 | 7/2004 | Sanderford, Jr. et al. |
| 2004/0170217 A1 | 9/2004 | Ho |
| 2004/0183687 A1 | 9/2004 | Petite et al. |
| 2004/0192415 A1 | 9/2004 | Luglio et al. |
| 2004/0193998 A1 | 9/2004 | Blackburn et al. |
| 2004/0215412 A1 | 10/2004 | Yoshida et al. |
| 2004/0218616 A1 | 11/2004 | Ardalan et al. |
| 2004/0246907 A1 | 12/2004 | Hoffmann |
| 2004/0252701 A1 | 12/2004 | Anandakumar et al. |
| 2004/0264379 A1 | 12/2004 | Srikrishna et al. |
| 2004/0264435 A1 | 12/2004 | Chari et al. |
| 2005/0018751 A1 | 1/2005 | Roy et al. |
| 2005/0024235 A1 | 2/2005 | Shuey et al. |
| 2005/0030199 A1 | 2/2005 | Petite et al. |
| 2005/0036487 A1 | 2/2005 | Srikrishna |
| 2005/0043059 A1 | 2/2005 | Petite et al. |
| 2005/0043860 A1 | 2/2005 | Petite |
| 2005/0052290 A1 | 3/2005 | Naden et al. |
| 2005/0052328 A1 | 3/2005 | De Angelis |
| 2005/0053047 A1 | 3/2005 | Osterloh et al. |
| 2005/0068970 A1 | 3/2005 | Srikrishna et al. |
| 2005/0074015 A1 | 4/2005 | Chari et al. |
| 2005/0086287 A1* | 4/2005 | Datta .................. A63F 13/34 709/201 |
| 2005/0086329 A1* | 4/2005 | Datta .................. H04L 12/18 709/220 |
| 2005/0097386 A1* | 5/2005 | Datta .................. A63F 13/34 714/4.3 |
| 2005/0105524 A1 | 5/2005 | Stevens et al. |
| 2005/0129005 A1 | 6/2005 | Srikrishna et al. |
| 2005/0147097 A1 | 7/2005 | Chari et al. |
| 2005/0163144 A1 | 7/2005 | Srikrishna et al. |
| 2005/0169020 A1 | 8/2005 | Knill |
| 2005/0171696 A1 | 8/2005 | Naden et al. |
| 2005/0172024 A1 | 8/2005 | Cheifot et al. |
| 2005/0190055 A1 | 9/2005 | Petite |
| 2005/0195768 A1 | 9/2005 | Petite et al. |
| 2005/0195775 A1 | 9/2005 | Petite et al. |
| 2005/0201397 A1 | 9/2005 | Petite |
| 2005/0218873 A1 | 10/2005 | Shuey et al. |
| 2005/0226179 A1 | 10/2005 | Behroozi |
| 2005/0227615 A1 | 10/2005 | Sakoda |
| 2005/0243867 A1 | 11/2005 | Petite |
| 2005/0251401 A1 | 11/2005 | Shuey |
| 2005/0251403 A1 | 11/2005 | Shuey |
| 2005/0270173 A1 | 12/2005 | Boaz |
| 2005/0271006 A1 | 12/2005 | Chari et al. |
| 2005/0278440 A1 | 12/2005 | Scoggins |
| 2006/0002350 A1 | 1/2006 | Behroozi |
| 2006/0007863 A1 | 1/2006 | Naghian |
| 2006/0012935 A1 | 1/2006 | Murphy |
| 2006/0018303 A1 | 1/2006 | Sugiarto et al. |
| 2006/0038548 A1 | 2/2006 | Shuey |
| 2006/0039280 A1 | 2/2006 | Anandakumar et al. |
| 2006/0039450 A1 | 2/2006 | Fulton et al. |
| 2006/0043961 A1 | 3/2006 | Loy |
| 2006/0071810 A1 | 4/2006 | Scoggins et al. |
| 2006/0071812 A1 | 4/2006 | Mason, Jr. et al. |
| 2006/0195610 A1 | 8/2006 | Cole et al. |
| 2006/0203105 A1 | 9/2006 | Srinivasan |
| 2006/0205358 A1 | 9/2006 | Itoh et al. |
| 2006/0217936 A1 | 9/2006 | Mason et al. |
| 2006/0246913 A1 | 11/2006 | Merboth et al. |
| 2006/0253700 A1 | 11/2006 | Della-Libera et al. |
| 2007/0028122 A1 | 2/2007 | Chuang |
| 2007/0050523 A1 | 3/2007 | Emeott et al. |
| 2007/0067121 A1 | 3/2007 | Przydatek et al. |
| 2007/0073866 A1 | 3/2007 | Rudran et al. |
| 2007/0076649 A1 | 4/2007 | Lin et al. |
| 2007/0121521 A1 | 5/2007 | D'Amico et al. |
| 2007/0176789 A1 | 8/2007 | Kim |
| 2007/0229256 A1 | 10/2007 | Seal et al. |
| 2007/0236362 A1 | 10/2007 | Brian et al. |
| 2008/0068212 A1 | 3/2008 | Tay et al. |
| 2008/0095075 A1 | 4/2008 | Monier |
| 2008/0250154 A1 | 10/2008 | Sun et al. |
| 2009/0016293 A1 | 1/2009 | Kang et al. |
| 2009/0146839 A1 | 6/2009 | Reddy et al. |
| 2009/0175293 A1* | 7/2009 | Xia .................. H04W 28/18 370/462 |
| 2009/0271685 A1* | 10/2009 | Li .................. H03M 13/03 714/776 |
| 2009/0313517 A1* | 12/2009 | Schedelbeck .......... H04L 1/0083 714/748 |
| 2010/0164719 A1 | 7/2010 | George et al. |
| 2012/0117446 A1 | 5/2012 | Taghavi Nasrabadi et al. |
| 2012/0287772 A1* | 11/2012 | Wan .................. H04L 12/40 370/216 |
| 2013/0128876 A1* | 5/2013 | Kilian .................. H03M 13/6306 370/347 |
| 2014/0126580 A1 | 5/2014 | Sampath et al. |
| 2015/0092711 A1* | 4/2015 | Tabet .................. H04L 1/0045 370/329 |
| 2016/0353430 A1* | 12/2016 | Chen .................. H04W 72/0413 |
| 2017/0104555 A1* | 4/2017 | Darbha .................. H04L 69/22 |
| 2018/0077605 A1* | 3/2018 | Maheshwari .......... H04L 69/321 |
| 2018/0176945 A1* | 6/2018 | Cao .................. H04L 1/1822 |
| 2018/0309553 A1* | 10/2018 | Cao .................. H04W 72/046 |
| 2019/0081756 A1* | 3/2019 | Yan .................. H04W 72/042 |
| 2019/0097936 A1* | 3/2019 | Yang .................. H04W 28/0268 |
| 2019/0288791 A1* | 9/2019 | Hwang .................. H04L 12/1868 |

FOREIGN PATENT DOCUMENTS

| | | |
|---|---|---|
| WO | 2006083696 A2 | 8/2006 |
| WO | 2006096854 A2 | 9/2006 |

OTHER PUBLICATIONS

Advisory Action dated Jun. 11, 2010, for U.S. Appl. No. 11/900,202, 2 pages.

Extended European Search Report for European Application No. EP 09156694.3, dated May 7, 2010, 7 pages.

Final Office Action dated Jun. 3, 2014, for U.S. Appl. No. 13/780,001, 6 pages.

Final Office Action dated Mar. 24, 2010, for U.S. Appl. No. 11/900,202, 6 pages.

Non-Final Office Action dated Aug. 24, 2009, for U.S. Appl. No. 11/900,202, 6 pages.

Non-Final Office Action dated Jan. 13, 2014, for U.S. Appl. No. 13/780,001, 8 pages.

Non-Final Office Action dated Jan. 2, 2014, for U.S. Appl. No. 13/833,252, 6 pages.

Non-Final Office Action dated Jul. 17, 2012, for U.S. Appl. No. 12/902,853, 7 pages.

Notice of Allowance dated May 27, 2014, for U.S. Appl. No. 13/833,252, 5 pages.

Notice of Allowance dated Aug. 13, 2014, for U.S. Appl. No. 13/780,001, 7 pages.

Notice of Allowance dated Jul. 12, 2010, for U.S. Appl. No. 11/900,202, 6 pages.

Notice of Allowance dated Nov. 13, 2012, for U.S. Appl. No. 12/902,853, 7 pages.

PCT International Search Report and Written Opinion dated Jun. 26, 2008, for PCT International Application No. PCT/US07/20022, 30 pages.

Catalani, "Polymatrix and Generalized Polynacci Numbers," Depailment of Economics, University of Torino, Torino, Italy, Oct. 14, 2002, 10 pages.

Conti, et al., "MobileMAN Architecture, Protocols and Services," Mobile Metropolitan Ad hoc Networks, Sep. 2003, 165 pages.

(56) References Cited

OTHER PUBLICATIONS

Iannone, et al., "Cross-Layer Routing in Wireless Mesh Networks," Universite Pierre et Marie Curie, IEEE Xplore Conference: 1st International Symposium on Wireless Communication Systems, Mauritius, Sep. 20-22, 2004, 6 pages.

Jeyakumar, et al., "Genetic Algorithm for Optimal Design of Delay Bounded WDM Multicast Networks," Government College of Technology, TENCON 2003: Conference on Convergent Technologies for Asia-Pacific Region, Bangalore, India, Oct. 15-17, 2003, 5 pages.

Kozat, et al., "Network Layer Support for Service Discovery in Mobile Ad Hoc Networks," INFOCOM 2003, Twenty-Second Annual Joint Conference of the IEEE Computer and Communications Societies, San Francisco, California, Mar. 30-Apr. 3, 2003, 12 pages.

Krishnamurthy, et al., "RESTORE: A Real-Time Event Correlation and Storage Service for Sensor Networks," In Proc. of INSS 2006: Third Int'l Conference on Networked Sensing Systems, May 31-Jun. 2, 2006, Rosemont, Illinois, 9 pages.

Tanenbaum, Computer Networks, Section 5.2 (Routing Algorithms), pp. 289-307, Prentice Hall, Enqlewood Cliffs, NJ, copyright 1988, 19 pages.

Xu, et al., "Optimal Topology Discovery for Automatic Meter Reading Using Powerline Carrier," University of Auckland, Auckland, New Zealand, 2003, 53 pages.

Younis, et al., "Energy-Aware Routing in Cluster-Based Sensor Networks," Proc. of the 10th IEEE International Symposium on Modeling, Analysis & Simulation of Computer & Telecommunications Systems (MASCOTS'02), Piscataway, NJ, Oct. 16, 2002, 20 pages.

Yu, et al., "A Minimum Delay Routing Protocol for Bluetooth Radio Networks," presented at Aletheia International Symposium of Mathematical Sciences, Aletheia University, Taiwan, pp. 291-314, Tamsui Oxford Journal of Mathematical Sciences, 20(2), 2004, 24 pages.

Tang, et al., "Dynamic Lightpath Establishment in Wavelength-Routed WDM Networks," IEEE Communications Magazine, vol. 39, Issue 9, Sep. 2001, 9 pages.

Notice of Allowance dated Jul. 1, 2020, for U.S. Appl. No. 15/993,871, 12 pages.

Notice of Allowance dated Mar. 6, 2020, for U.S. Appl. No. 15/993,871, 12 pages.

Notice of Allowance dated Nov. 18, 2019, for U.S. Appl. No. 15/993,871, 13 pages.

PCT International Search Report and Written Opinion dated Sep. 23, 2019, for PCT International Application No. PCT/US2019/33886, 12 pages.

\* cited by examiner

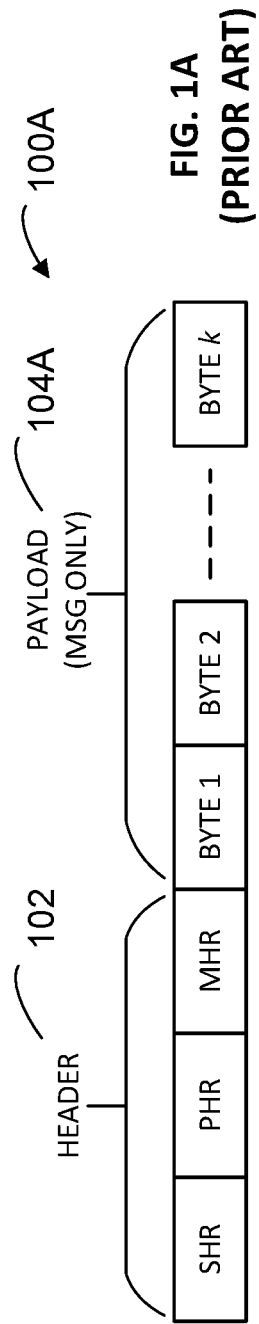
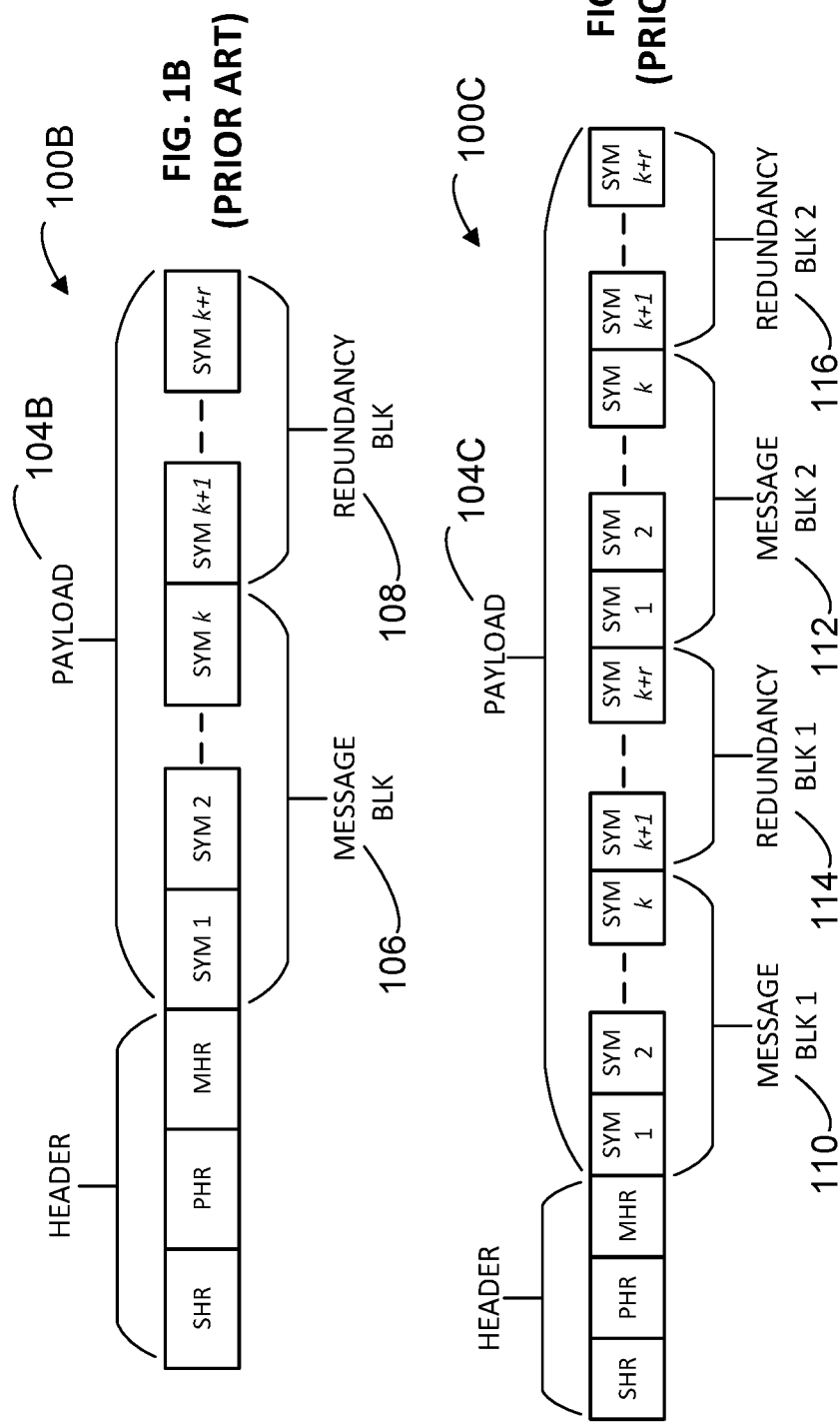

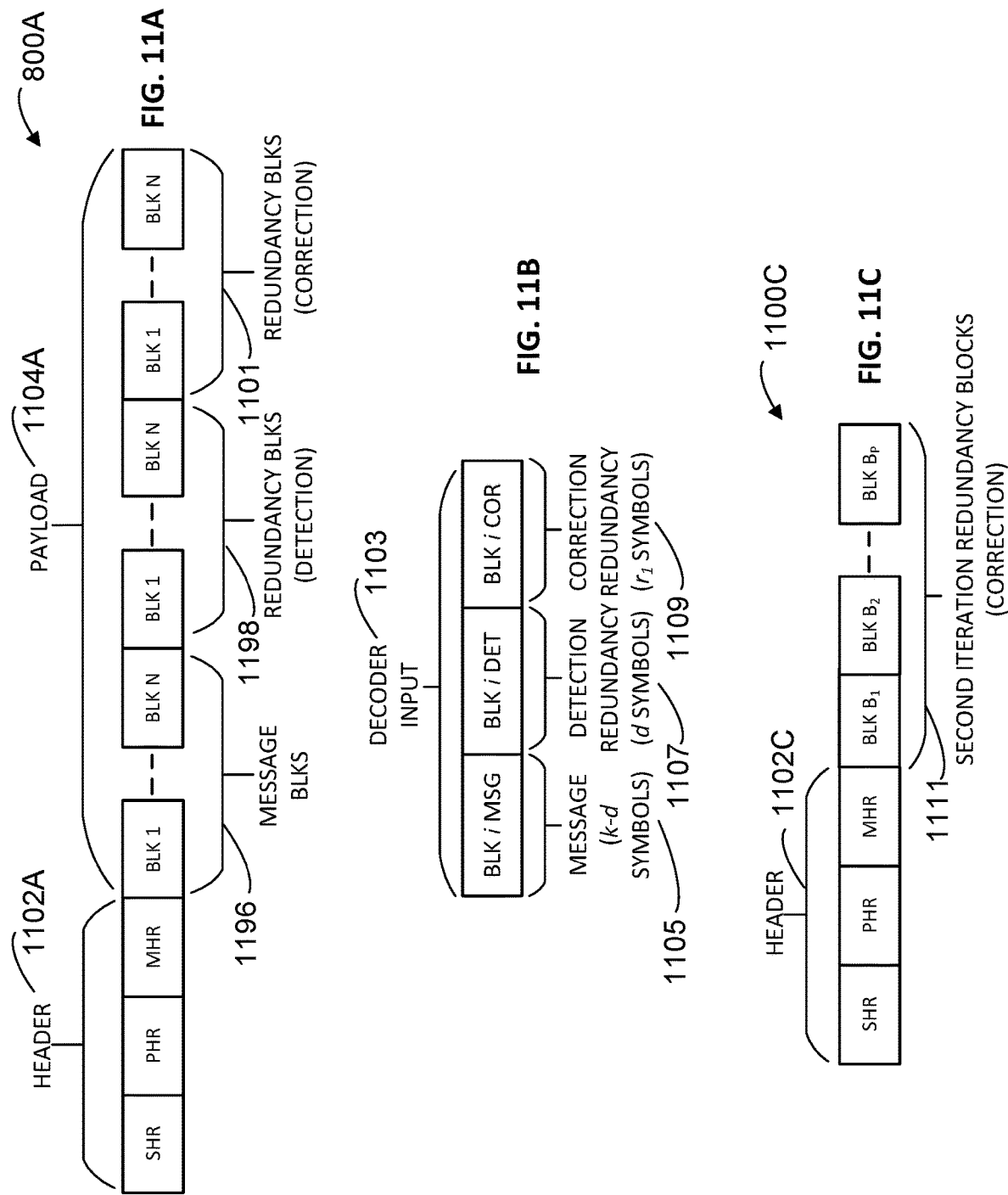

MESSAGE CORRECTION AND DYNAMIC CORRECTION ADJUSTMENT FOR COMMUNICATION SYSTEMS

RELATED APPLICATIONS

This application is a continuation of U.S. patent application Ser. No. 15/993,871, titled "MESSAGE CORRECTION AND DYNAMIC CORRECTION ADJUSTMENT FOR COMMUNICATION SYSTEMS," filed May 31, 2018, which is incorporated herein by reference in its entirety.

FIELD OF THE DISCLOSURE

This disclosure relates generally to data communications, and more particularly to message correction in data communications.

BACKGROUND

In typical data communication systems (including wired and/or wireless communication systems such as radio frequency (RF) communications, cellular communications, optical communications, power line communications, etc.), a message may be sent from a source (e.g., a sending device) to a destination (e.g., one or more receiving devices). Occasionally, however, a message may not be received fully intact (e.g., one or more message blocks may be missing or corrupted). As an example, some communication networks (e.g., an Advanced Metering Infrastructure (AMI), the Internet of Things (IoT), Distributed Automation (DA), etc.), may use license free bands and their communications are therefore prone to suffer from interference resulting in messages not always being received successfully. Some known ways of overcoming the interference problem include adjusting data rates and modulation, and/or using segmentation to break large messages into smaller packets. Forward error correction (FEC) may also be used, in which a message is encoded in a redundant way using an error-correcting code (e.g., Reed-Solomon or other error-correcting code), which may allow limited errors to be corrected at the receiving device. Given current standards for various communication networks, limited options are available for error correction, however. With or without these solutions to deal with interference, if a message is not received correctly (e.g., a message block is missing or corrupted), the full message may need to be resent, or perhaps even re-routed through an alternate path to be delivered correctly. Furthermore, with interference levels being very dynamic and with much variation (e.g., in amplitude across time), it is difficult for many communication systems to adjust to changes efficiently using the currently known solutions. The methods currently used in an attempt to optimize communications tend to be slow and may also consume significant network capacity. These solutions have difficulty reacting to fast-changing network conditions and thus tend to converge to a sub-optimal state.

Some examples of typical data packets are shown in FIGS. 1A-1C. FIG. 1A depicts a typical data packet 100A used in a communication system (e.g., a radio communication system), including a header 102 and a payload 104A. Header 102 may include a synchronization header (SHR) to allow a receiver of a receiving device to synchronize with a remote transmitter and detect the start of the packet. Header 102 may also include a physical header (PHR) that may contain information on the modulation type, data rate, packet length, etc. Other header information included in header 102 may be specific to the communication system. An example of additional header information may include a MAC layer header (MHR) that may contain information such as network addresses. As would be understood by one of ordinary skill in the art, the inclusion of an MHR header, and/or other headers, may be arbitrary, as they may be considered part of payload 104A. Payload 104A is the part of data packet 100A that contains the information being transmitted. In this example, packet 100A includes a single message block and contains no redundancy or error correction.

In many communication systems, forward error correction (FEC) may be implemented by appending redundancy data to a data packet to detect and/or correct errors in the message block(s) of the payload. FIG. 1B depicts a typical data packet 100B in which its payload 104B includes a message block 106 and also a redundancy block 108. Block codes used for forward error correction may include any type of error correction block codes (e.g., Reed-Solomon or other types of block codes such as Turbo, low-density parity-check (LDPC), Golay, BCH, Multidimensional Parity, Hamming, etc.), as would be understood by one of ordinary skill in the art. Note that while data packet 100A includes a payload 104A made up of bytes, payload 104B is shown as being made up of symbols. This is simply to show that while a symbol may be a byte long, it may also have a different size.

Long message blocks and block codes may lead to very complex computations. Therefore, the length of message blocks and block codes may be limited in that a long message may be broken down into several blocks. FIG. 1C depicts another typical data packet 100C in which its payload includes two message blocks (message block 110 and message block 112) instead of one large message block, with each message block followed by a corresponding redundancy block (redundancy block 114 and redundancy block 116).

A known practice frequently used to improve forward error correction in multi-block packet communication is interleaving. Interleaving is often effective for burst error correction, where interference may have corrupted, or caused the loss of, sequential message symbols. Interleaving may be implemented in several ways. In one example, the redundancy symbols may be computed and ordered as shown in FIG. 1C, but the blocks or symbols may be sent in an interleaved way (e.g., in a different order). When interleaving is used, a long burst of interference that may corrupt or lose several symbols in a row will distribute those errors over several blocks, making the errors easier to correct with an appropriate error-correcting code.

Sequence diagrams of FIGS. 2A and 2B illustrate examples of currently known data communication using redundancy between a sending device 218 and a receiving device 220 with error detection (FIG. 2A) and with error detection and correction (FIG. 2B). As shown in FIG. 2A, sending device 218 may send a packet, with redundancy for error detection, to receiving device 220 (222). Receiving device 220 may use the provided redundancy to check for errors (224). If no errors, receiving device 220 may send an acknowledgement of successful receipt to sending device 218 (226). If errors are detected, receiving device 220 may send a request to sending device 218 to resend the packet (228). In response to the request to resend, sending device 218 may resend the entire packet, with redundancy, to receiving device 220 (230). This process may continue until the packet is successfully received or until a threshold limit of resending is reached.

As depicted in FIG. 2B, sending device 218 may send a packet, with redundancy for error detection and correction, to receiving device 220 (232). Receiving device 220 may use the provided redundancy to check for, and possibly attempt to correct, errors (234). If no errors, or errors detected were correctable, receiving device 220 may send an acknowledgement of successful receipt to sending device 218 (236). If errors are detected but are not fully correctable, receiving device 220 may send a request to sending device 218 to resend the packet (238). In response to the request to resend, sending device 218 may resend the entire packet, with redundancy, to receiving device 220 (240). This process may continue until the packet is successfully received or until a threshold limit of resending is reached.

The practices described above that are used to alleviate interference issues in data communications, while useful, do have drawbacks. Transmitting redundancy may slow down the network due to the time required to create, send, and decode the additional symbols. Also, if the redundancy is not enough to repair the packet at the receiving device, an entire data packet will need to be re-sent. Furthermore, while interleaving is generally effective, it may increase delay because an entire interleaved block must be received before the symbols can be decoded.

BRIEF DESCRIPTION OF THE DRAWINGS

FIGS. 1A-1C illustrate example data packets that may be used in typical data communications. FIG. 1A depicts a data packet with no forward error correction (FEC). FIG. 1B depicts a data packet with single block appended redundancy. FIG. 1C depicts a data packet with two-block appended redundancy.

FIG. 11A illustrates an example multi-block data packet including initial error detection redundancy blocks and initial error correction redundancy blocks sent to a receiving device by a sending device, where the decoder input for a particular block may be as shown in FIG. 11B, according to an embodiment of the present disclosure.

FIG. 11C depicts an example second iteration redundancy packet received from the sending device upon request by the receiving device if the initial redundancy packet decoding (e.g., of the multi-block data packet of FIG. 11A) is not successful, where the included redundancy blocks are for all message blocks or only the message blocks identified as erroneous, according to embodiments of the present disclosure.

Figure 2A:
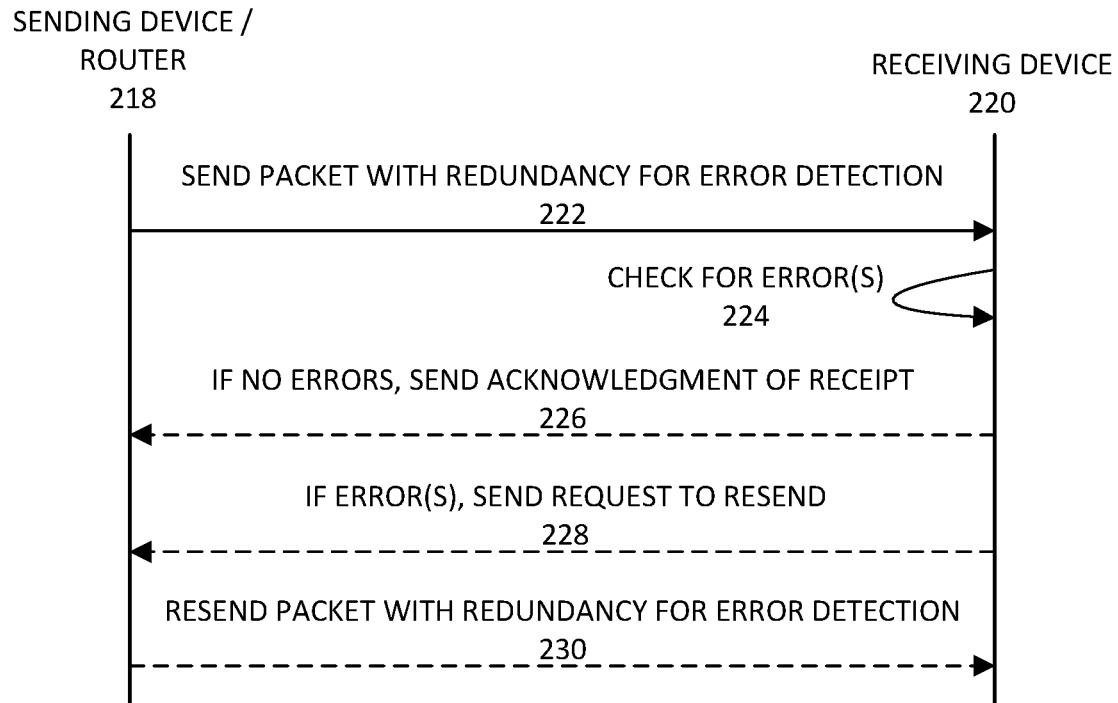
FIGS. 2A and 2B are sequence diagrams illustrating examples of typical data communication between a sending device and a receiving device with error detection (FIG. 2A) and with error detection and correction (FIG. 2B).
Figure 2B:
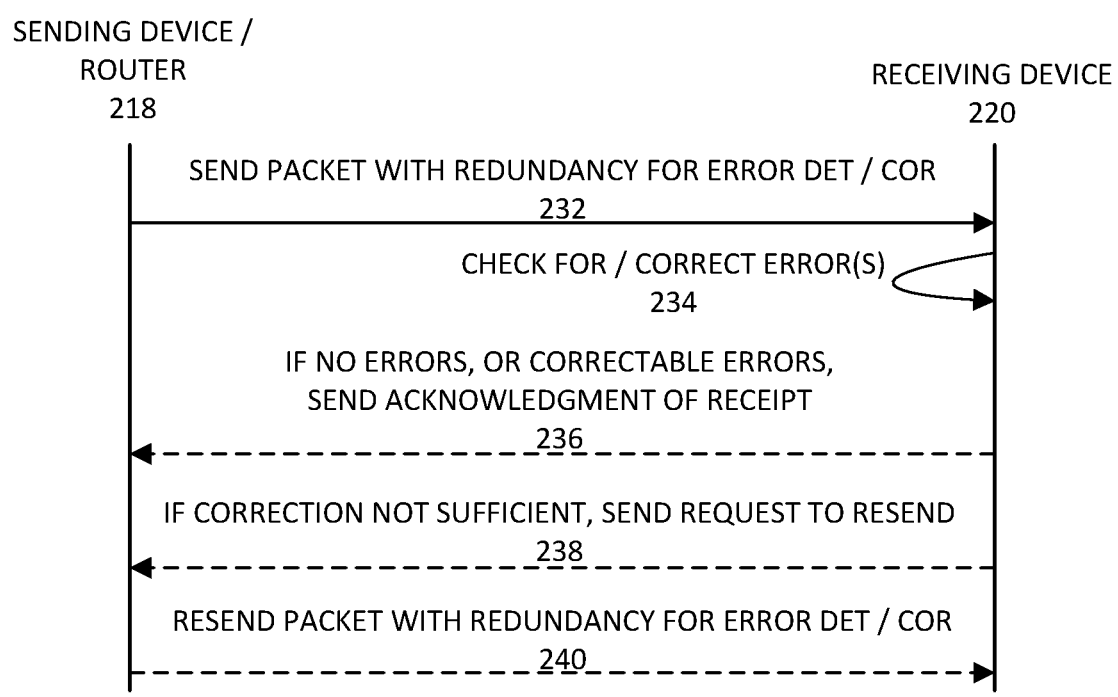

In the drawings, the leftmost digit(s) of a reference number may identify the drawing in which the reference number first appears.

DETAILED DESCRIPTION

The description herein discloses message correction techniques that may be used to dynamically optimize data transmissions while avoiding the downsides of the approaches currently used. The technology described herein provides efficient data correction and improved data transmission optimization with minimization of bandwidth usage and processing time, while maintaining the ability to adhere to a communication standard. As described in more detail below, the optimized error-correction techniques may further include dynamically adjusting to changes in the network and communication link conditions.

Embodiments are now described with reference to the figures, where like reference numbers may indicate identical or functionally similar elements. While specific configurations and arrangements are discussed, it should be understood that this is done for illustrative purposes only. A person skilled in the relevant art will recognize that other configurations and arrangements can be used without departing from the spirit and scope of the description. It will be apparent to a person skilled in the relevant art that the technology disclosed herein can also be employed in a variety of other systems and applications other than what is described herein.

Figure 3:
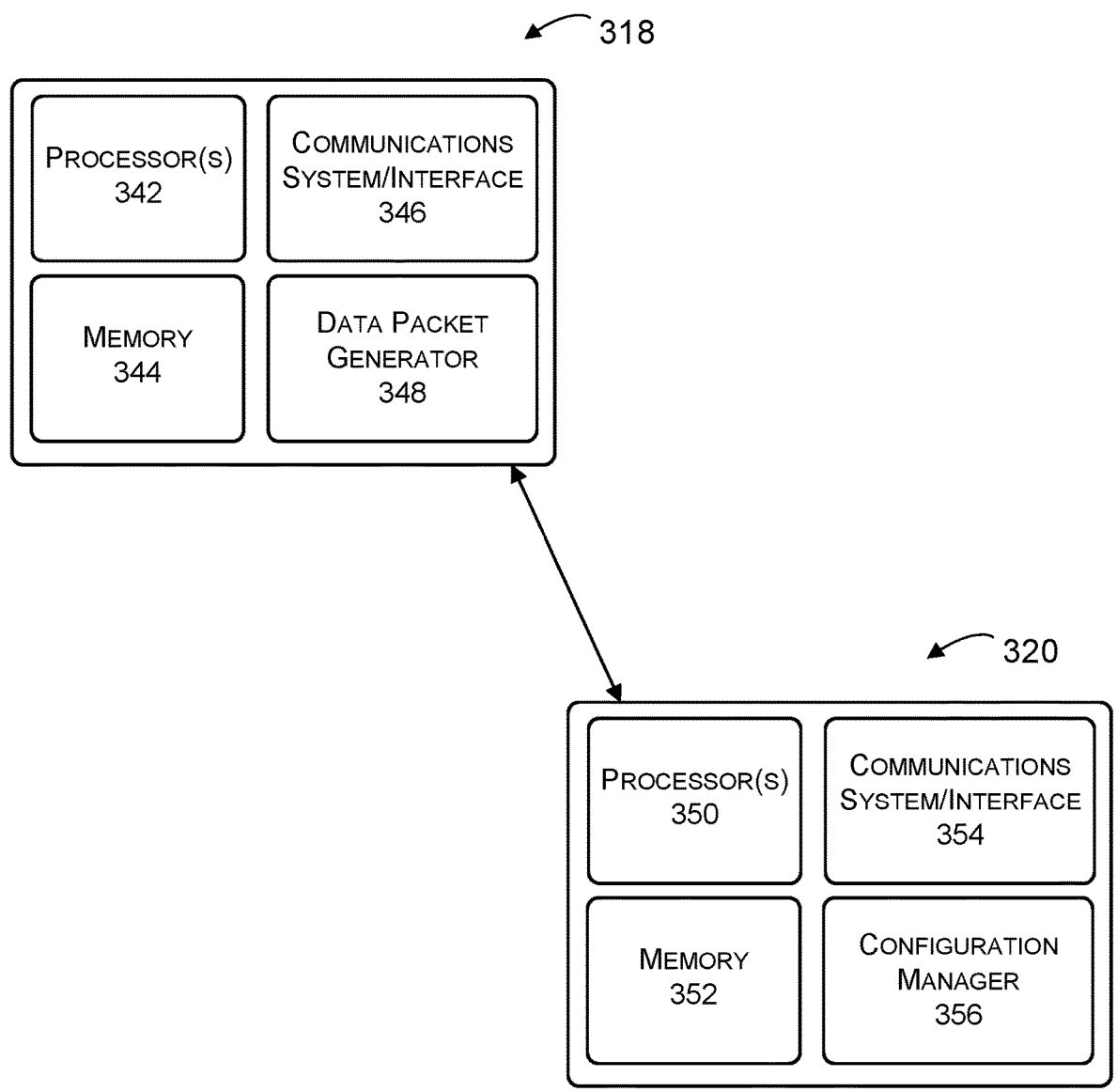
FIG. 3 is a block diagram of an example sending device and an example receiving device, according to an embodiment of the present disclosure.

FIG. 3 is a block diagram of a sending device 318 and a receiving device 320, according to embodiments of the present disclosure. Sending device 318 may include one or more processor(s) 342, a memory 344, and a communication system/interface 346. Sending device 318 may also include a data packet generator 348, which in some embodiments may be encompassed by processor(s) 342. Receiving device 320 may include one or more processor(s) 350, a memory 352, and a communication system/interface 354. Processor(s) 350 may include one or more decoders as referred to throughout this description. Receiving device 320 may also include a configuration manager 356, which in some embodiments may be encompassed by processor(s) 350. Sending device 318 and receiving device 320 may be in communication via their communication systems/interfaces 346 and 354 over a network (e.g., wired or wireless, LAN, WAN, Internet, etc.).

Error Correction Code Selection and Setup

Prior to implementation of a communication system/method as described herein, an error correction code is to be selected and the code parameters/attributes defined. As mentioned above, there are various error correction codes that may be used. One example of an error correction code is the Reed-Solomon code, as would be familiar to those of ordinary skill in the relevant art. In this disclosure, the Reed-Solomon code will be the example code used as needed for description.

One attribute to be defined for a selected error correction code is symbol size. With a Reed-Solomon code, a typical symbol size is 8 bits (or 1 octet) The length of the resulting codeword is tied to the symbol size, such that the codeword length may be equal to $2^{(Symbol\ Size)}-1$. Thus, for a symbol size of 8, the codeword length would be equal to $2^8-1$, or 255 bytes. In coding theory, a codeword may include a message followed by its redundancy symbols. A codeword may be shortened if not all symbols are used. For example, if a Reed-Solomon message includes 180 symbols and is followed by 20 redundancy symbols, then there are 55 unused symbols. These unused symbols may be replaced by leading zeros in the codeword during the coding process. These leading zeros do not need to be included with a transmitted data packet, and on the receiving end, the unused symbols may need to be replaced again with zeros for the decoding process. Shortened codes require less computing power, and also increase the error detection capability. (For example, if symbols 1 to 55 are unused, and if the decoder indicates that symbol number 5 is incorrect, it would become apparent that the decoding process failed and that an error remains uncorrected.)

The symbol size attribute, and other attributes (e.g., number of redundancy symbols per codeword, number of symbols per codeword, interleaving pattern (if used), etc.), for a selected error correction code should ideally be chosen after a system analysis. The chosen attributes may depend on such aspects as the probability of losing data packets, the computing power available, the amount of redundancy that can be afforded, etc. Once the error correction code has been selected and its attributes defined, a determination of how to split the redundancy symbols into several parts, with each part to be sent in a different iteration, needs to occur, as discussed in more detail below.

Data Packet Generation

Figure 4:
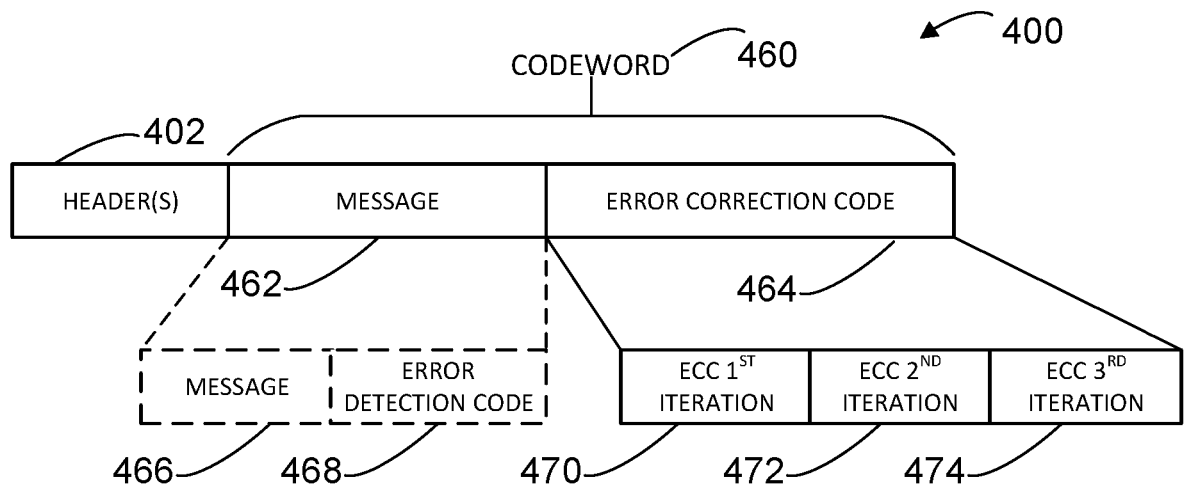
FIG. 4 depicts an example of a communication including a codeword to be input to a decoder for error detection and/or correction, according to embodiments of the present disclosure.

Referring to FIG. 4, a data packet 400 to be generated by a sending device (e.g., sending device 318, via data packet generator 348) and transmitted to a receiving device (e.g., receiving device 320) may include one or more headers 402 and a codeword 460, which may comprise a message 462 followed by redundancy information 464. As discussed earlier, header(s) typically include a MAC header (MHR), a synchronization header (SHR), and a physical header (PHR). The MHR may contain a sender address and destination address(es). The PHR may contain information related to the coding and modulation used for the message, and may also include the packet length. The SHR may contain signals that may be used to facilitate a synchronization process at the receiving device. Other information may also be included in the one or more headers. In addition, an error detection code may be generated by the sending device based on the message, and the error detection code may be appended to the message as part of the codeword to enable global error detection in the message. In an embodiment, the generated error detection code 468 may be appended to an original message 466 to form message 462.

The use of redundancy information in a data packet is optional, but beneficial to correct any errors in a message without necessarily having to resort to a resend of the original data packet. To generate the redundancy information, the sending device (e.g., via data packet generator 348) may divide message 462 into blocks or symbols, and for each block/symbol, redundancy symbols may be generated. Redundancy symbols are the result of a polynomial division based on an input message, where the remainder of the division is a sequence of redundancy symbols. (The generation of redundancy symbols is a known process and will not be discussed further in this document.) Once the redundancy symbols are generated, they may be appended to message 462 as error correction code 464 to complete codeword 460. In the example shown, error correction code 464 is made up of a first iteration error correction code 470, a second iteration error correction code 472, and a third iteration error correction code 474. While in this example three iterations are shown, the error correction code may include a different number of iterations. The maximum number of iterations generated/appended may be limited by the chosen codeword length.

Figure 5:
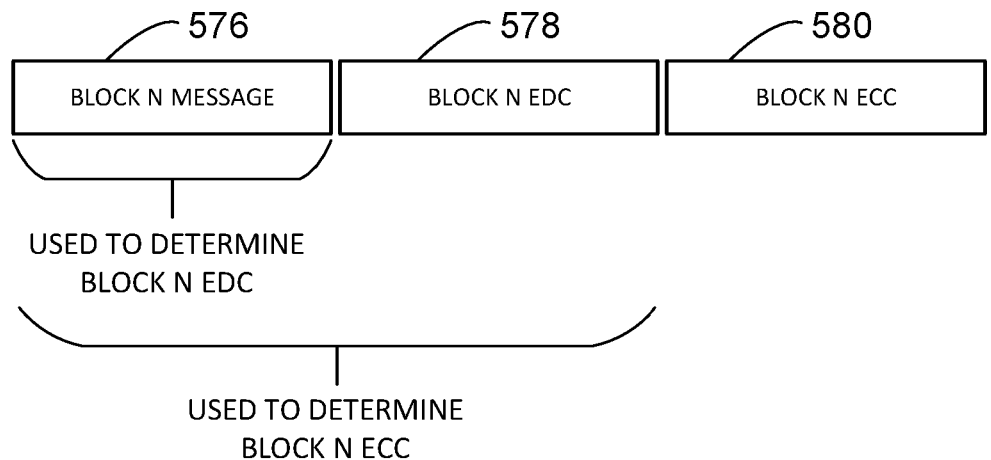
FIG. 5 depicts an example of the data that may be used to determine an error detection code and an error correction code.

In an embodiment, error detection may be used for each individual message block, in addition to or instead of using error detection for the entire message as discussed above with regard to error detection code 468. The error detection method (e.g., the error detection polynomial used) may be part of the system design and known to both sending devices and receiving devices (as would also be the error correction code), as would be understood by those of ordinary skill in the relevant art. Referring to FIG. 5, for each message block 576, an error detection code 578 may be determined based on block 576. In turn, error correction code 580 may be determined based on both message block 576 and error detection code 578. The determined error detection codes and error correction codes may then be placed at the end of the data packet, after the message. Use of error detection and correction for each message block allows for possible errors in the error detection code to be corrected by a decoder of a receiving device. The error detection/correction coding process may be identical for all iterations determined. As such, a single decoder may be used at the receiving device(s).

Once this coding is complete, there may be additional coding and modulation conducted (including, e.g., scrambling, interleaving, spreading, pulse shaping, etc.), as would be understood by those of ordinary skill in the relevant art. Some modulations may use additional error correction coding. Thus, combined, or nested, error correction may be present, allowing for further reinforced error correction.

As stated above, once the parts of a data packet are determined, including its header(s), message, optional error detection code(s), and error correction code symbols for one or more iterations, the error correction code symbols to actually send with the initial message need to be determined, saving the rest for possible future sent iterations, if such iterations are needed. The determination of which error correction codes symbols to send (as well as the determination of other parameters related to the iterative decoding described herein) may be made in various ways. In an embodiment, these determinations may be predetermined, based on a prior system analysis, and the sending device and/or receiving device may be informed through configuration. In another embodiment, these determinations may be made (e.g., by the sending device) for each individual transmission (e.g., based on network condition history, past transmission statistics, etc.), with the sending device informing the receiving device via an additional header placed prior to the redundancy symbols, preferably so as to not interfere with standard header and message information (e.g., placed after the message but prior to redundancy symbols), or as a proprietary information element of the standard message header (which will be ignored by non-intended receiving devices). In a further embodiment, these determinations may be predetermined (e.g., for each individual sending device, or preconfigured as a default for all sending devices in the system), but may be dynamically adjusted based on past performance (e.g., network condition history, past transmission statistics, etc.). The initial data packet generated by a sending device may then include its header(s), message, optional error detection code(s), and the selected error correction code symbols for the first iteration. Any leading zeros and any placeholder zeros completing the codeword after the selected error correction symbols may be left off for the transmission. The data packet may then be transmitted to one or more receiving device(s) via any wired/wireless communications, as would be understood by those of ordinary skill in the relevant art.

Recognition of Included Redundancy

One key feature of this disclosure is the ability of an intended receiving device to recognize that redundancy blocks are included in a message, while other receiving devices remain ignorant of the redundancy information. This feature allows usage in a more general environment with various receiving devices. In such an environment, a transmitted message may be able to comply with a general communication standard while allowing particular devices to receive additional information. As such, an intended receiving device may recognize and read in redundancy blocks appended after the standard packet, whereas non-intended receiving devices will stop listening at the end of the standard packet, oblivious to the existence of the appended redundancy information. There are various ways that recognition of the existence of redundancy information may be accomplished. For example, in an embodiment, indication of the existence of, and/or the number of, redundancy blocks may be provided in additional header information of a transmitted message (again, preferably so as to not interfere with standard header and message information (e.g., placed after the message but prior to redundancy symbols, or in a proprietary information element of the standard message header)). An intended receiving device may be configured to, and/or may have processing logic to, allow the receiving device to recognize and understand the additional header information, while other receiving devices may ignore this additional header information.

In another embodiment, the receiving device may have the ability to recognize the existence of redundancy information in a message with simply the standard information provided in the header of a transmitted message. For example, a receiving device may maintain (e.g., via configuration manager 356) a configuration file, or information base, that may contain a collection of parameters (e.g., instructional parameters, regulatory parameters, etc.) that the receiving device needs to operate. This information base may contain a flag to "listen for redundancy information". It may also contain a parameter that represents an expected number of redundancy symbols (e.g., in a first iteration, as further described below). Another parameter may be a flag to indicate that there are also error detection symbols present, which may be optionally used to detect whether errors are present after error correction is attempted, as discussed elsewhere herein. Upon implementation of a communication system, the flag for "listen for redundancy information" may be set to true or false. In an embodiment, this flag may be changed later if desired (e.g., depending on whether network conditions warrant use of this error correction capability or not). A receiving device, when receiving a message, may consult this "listen" flag. If the flag is set to "true", the receiving device may run processing logic to determine (if there is no parameter, or additional header information, that specifically indicates the number of redundancy symbols) the expected number of redundancy symbols based on one or more other parameters provided in the information base and/or in the provided header information (e.g., packet length, symbol size, number of symbols per codeword, number of redundancy symbols per codeword, interleaving pattern (if used), etc.). After demodulating and decoding the message blocks, the receiving device may then continue demodulating and decoding the determined number of symbols for use in error detection and/or correction, as further discussed below.

Receiving a Transmission

Figure 6A:
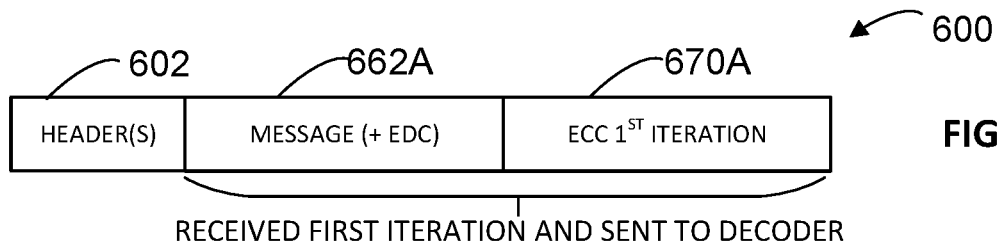
FIGS. 6A-6D are examples of a message and error correction iterations that may be prepared for input to an error correction decoder, according to embodiments of the present disclosure.

An example of a data packet sent by a sending device and received by a receiving device is shown in FIG. 6A, where a data packet 600 includes header(s) 602, a message 662A (optionally including error detection code as discussed earlier), and a first iteration error correction code 670A. Upon receipt by a receiving device, the receiving device may demodulate the data packet via known methods, optionally including (depending on the system), for example, carrier synchronization, de-whitening, de-spreading, de-interleaving, Fourier transform, and/or convolutional decoding, etc. After demodulation, etc., error correction decoding may take place.

Figure 6B:
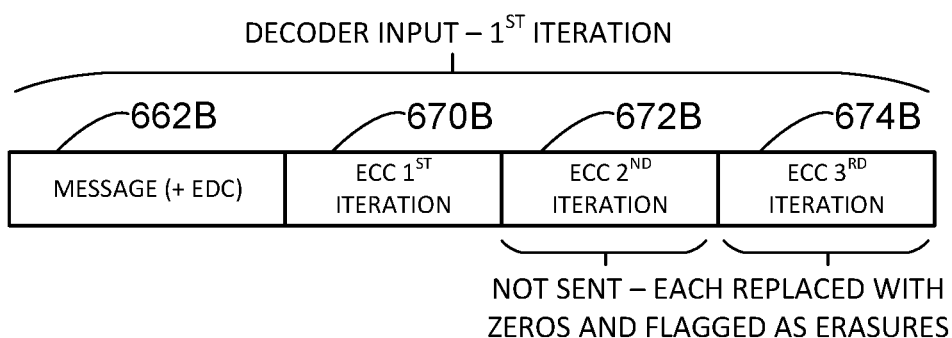

For error correction decoding of a multi-block message, the data packet may need to be separated into blocks, and decoder input codewords may need to be formed, including, for each message block, a message (optionally including error detection code) and a corresponding error correction code. For simplicity of description, the message 662A of data packet 600 will be considered a single-block message. For the initial attempt at error correction decoding, a first iteration decoder input codeword may be formed, as shown in FIG. 6B. This first iteration decoder input codeword may include message 662B (optionally including error detection code) and first iteration error correction code 670B (which may be identical to first iteration error correction code 670A as provided in data packet 600). However, decoder input codewords may need to be the full codeword length for decoding. Since the remaining determined iterations of the error correction code (for this example, the second and third iterations) were not sent with data packet 600, they (iterations 672B and 674B) may be included in the first iteration decoder input codeword as zeros and flagged as erasures prior to providing the first iteration decoder input codeword to the error correction decoder. In this way, the error correction decoder is informed that some redundancy symbols have not been received and so will not waste decoding effort on them. The error correction decoder may then perform its decoding with the identified erasures, as would be understood by those of ordinary skill in the relevant art.

Figure 6C:
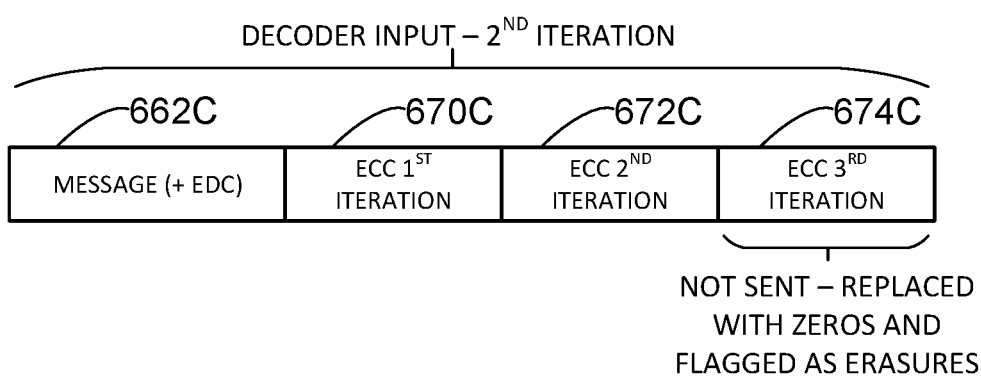
Figure 6D:
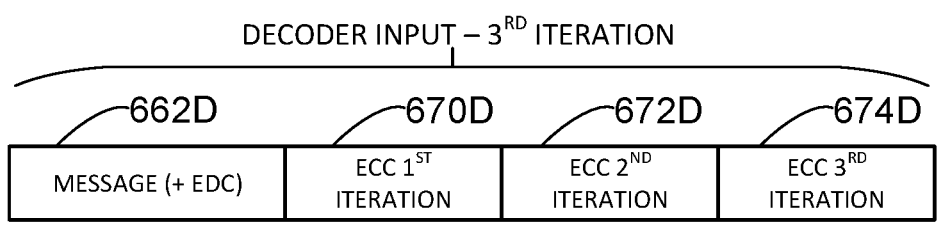

As will be described further below, if error correction is not successful, the receiving device may send a request to the sending device for further redundancy information associated with the earlier received data packet, after which the sending device may send to the receiving device a communication including the previously determined second iteration error correction code. The data packet sent with the second iteration error correction (and any follow-on iteration error correction code) may be recognizable only by intended receiving devices (e.g., via custom header information), whereas standard (not intended) receiving devices may reject these packets. Upon receipt of the second iteration error correction code, the receiving device may form a second iteration decoder input codeword as shown in FIG. 6C. This second iteration decoder input codeword may include message 662C (optionally including error detection code), first iteration error correction code 670C (which may be identical to first iteration error correction code 670A and 670B), and received second iteration error correction code 672C. Again, since decoder input codewords may need to be the full codeword length for decoding, and since the remaining determined iteration of error correction code (for this example, the third iteration) was not provided by the sending device, it (iteration 674C) may be included in the second iteration decoder input codeword as zeros and flagged as erasures prior to providing the second iteration decoder input codeword to the error correction decoder. The error correction decoder may then perform its decoding with the second iteration decoder input codeword, as would be understood by those of ordinary skill in the relevant art. Similarly, if error correction is still not successful, and a third iteration error correction code is requested and received, the third iteration decoder input may include message 662D (optionally including error detection code), first iteration error correction code 670D (which may be identical to first iteration error correction code 670A/B/C), second iteration error correction code 672D (which may be identical to second iteration error correction code 672C), and received third iteration error correction code 674D, as shown in FIG. 6D. While in this example three iterations are shown, the error correction code may include a different number of iterations. The maximum number of iterations generated/appended may be limited by the chosen codeword length.

If after all available iterations of redundancy are used for decoding but errors are still present, a message may be sent to the sending device indicating that decoding the message was not successful. In an embodiment, a request for a resend of the original data packet may be sent to the sending device. If the error correction decoding appears to be successful, an acknowledgment of successful receipt of the message may be sent to the sending device from the receiving device. Note, however, that it is possible that the error correction decoder may fail to correct all of the errors but may not be aware of it. Error correction decoders may be optimized for error correction, not error detection, though they may have error detection capability. For this reason, it may be beneficial to use an error detection method to confirm successful correction prior to sending an acknowledgment of successful receipt. This may be done with the global error detection code included in the message payload, as discussed earlier. If individual block error detection is implemented, the integrity of each block may be verified with the individual error detection codes that may have been appended at the end of the message payload, as previously described. For the individual block verification, each message block may need to be re-associated with its corresponding error detection code block. When using this individual block verification, it will be known which individual blocks still contain errors.

EXAMPLES

Figure 7A:
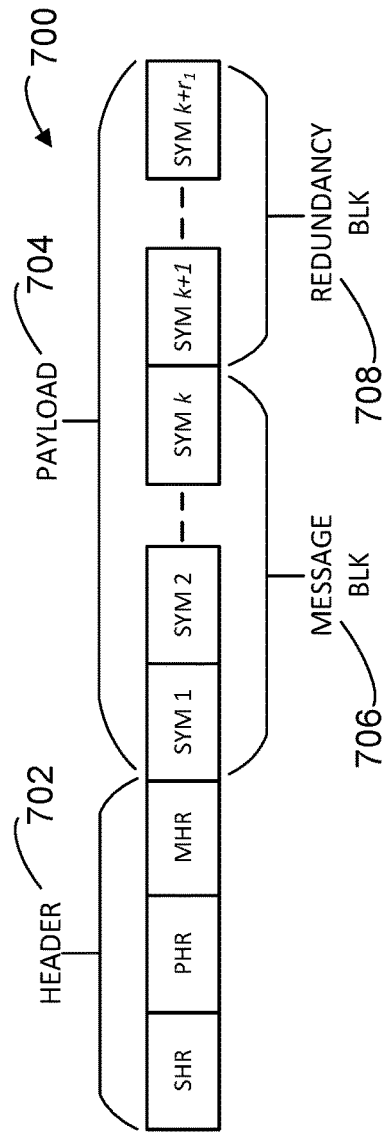
FIG. 7A depicts an example single block data packet with an initial redundancy sent from a sending device to a receiving device, where the decoder input may be as shown in FIG. 7B, according to an embodiment of the present disclosure.

FIG. 7A depicts an example data packet 700 with initial (first iteration) redundancy that may be generated (e.g., via data packet generator 348) and sent from sending device 318 to receiving device 320, according to an embodiment of the present disclosure. Data packet 700 is a single block packet that may include a header 702 and a payload 704. Payload 704 may include a message block 706 and a redundancy block 708 created and appended for error detection and/or correction of message block 706 by receiving device 320. Receiving device 320 may know (e.g., based on information from header 702, and/or via pre-configuration, as discussed above) how many message blocks or symbols are in payload 704. Receiving device 320 may then determine the number of redundancy symbols to expect appended at the end of the data packet and may receive those appended symbols.

Figure 7B:
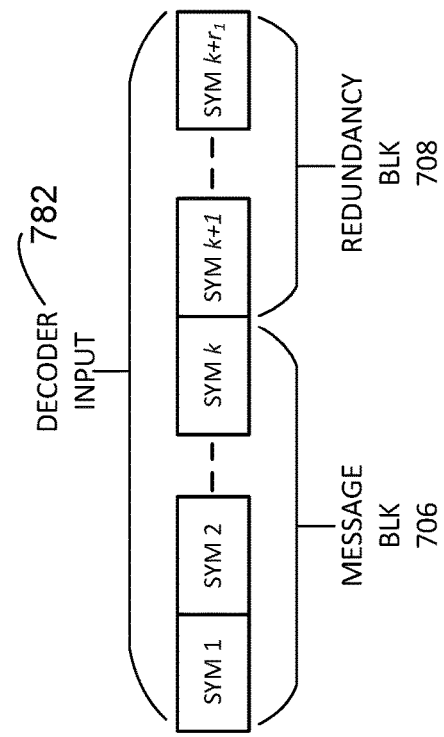

FIG. 7B shows an example of decoder input 782 (e.g., Reed-Solomon decoder input) that may be used by receiving device 320 as part of the decoding process for decoding message block 706. As shown in FIG. 7B, for this initial iteration, decoder input 782 may comprise message block 706 and redundancy block 708. If decoding of message block 706 by receiving device 320 is successful, receiving device 320 may send to sending device 318 an acknowledgement of successful receipt. In an embodiment, it may be confirmed that there are no errors in decoded message block 706 via an error detection method and provided error detection code(s) (as discussed above), as would be understood by those of ordinary skill in the art, prior to sending an acknowledgment of successful receipt. If decoding of message block 706 is not successful, receiving device 320 may send a request to sending device 318 for additional redundancy for data packet 700. Since data packet 700 is a first iteration data packet (and further requests for redundancy may be made), the initial redundancy (redundancy block 708) may be very short, which will ideally shorten data packet generation and transmission time, as well as free up network bandwidth. In an embodiment, the initial redundancy block (redundancy block 708) may intentionally be left empty such that receiving device 320 requests redundancy only if necessary, freeing up further time and bandwidth.

In an embodiment, the request sent by receiving device 320 to sending device 318 for additional redundancy may include communication condition information from the perspective of receiving device 320. Sending device 318 may use this information to adjust parameters for sending subsequent communications more effectively. For example, receiving device 320 may be able to evaluate the link quality (e.g., receive signal strength, signal-to-noise ratio, noise time profile, etc.) and based on this evaluation may be able to provide useful information to sending device 318 that may be used to optimize future communications. Communication condition information provided by receiving device 320 may include, for example but not limitation, received signal strength, signal-to-noise ratio, noise time profile, modulation information, data rate information, and/or history of previous transmission failures. Parameters that may be adjusted based on the provided condition information may include, for example but not limitation, size of message blocks, size of correction blocks, amount of redundancy, modulation type, modulation rate, and/or data rate. Adjusting these parameters may result in an increase in the number of message blocks that are received correctly and/or that can be corrected without further requests for redundancy (for example, if there are many errors (e.g., above a predetermined threshold), the data rate may be decreased, etc.).

Figure 8A:
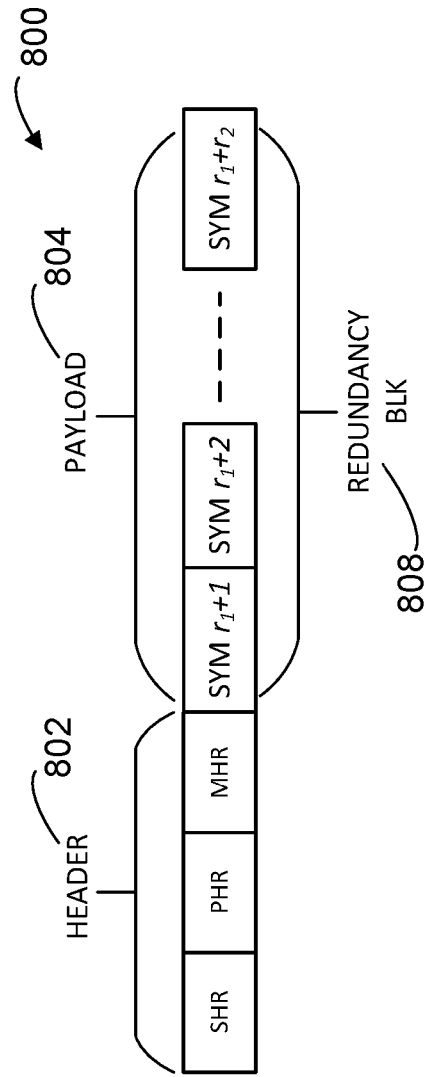
FIG. 8A illustrates an example second iteration redundancy packet received by the receiving device upon request to the sending device if the initial redundancy packet decoding is not successful, where the decoder input may be as shown in FIG. 8B, according to an embodiment of the present disclosure.
Figure 8B:
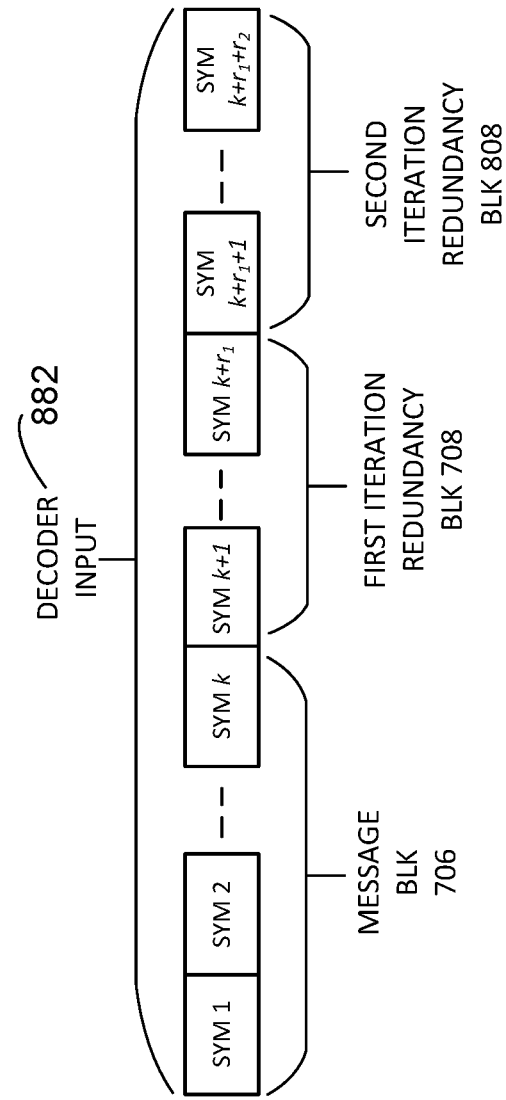

Referring now to FIG. 8A, in response to receiving a request for additional redundancy from receiving device 320, sending device 318 may send a redundancy data packet 800 to receiving device 320. Redundancy packet 800 includes a header 802 and a payload 804 that includes second iteration redundancy block 808 for message block 706. In a second attempt to decode message block 706, decoder input 882 of FIG. 8B may be used by receiving device 320. As shown in FIG. 8B, for this second iteration, decoder input 882 may comprise message block 706, redundancy block 708, and redundancy block 808. In an embodiment (and at any iteration of error correction), once errors are corrected, an error detection method may be used to confirm whether the error correction is successful. If decoding of message block 706 by receiving device 320 is successful, receiving device 320 may send to sending device 318 an acknowledgement of successful receipt. If decoding of message block 706 is again not successful, receiving device 320 may send another request to sending device 318 for additional redundancy for data packet 700. In an embodiment, this additional request for redundancy may include condition information from the perspective of receiving device 320 that sending device 318 may use to adjust parameters for sending subsequent communications, as discussed above.

Figure 9A:
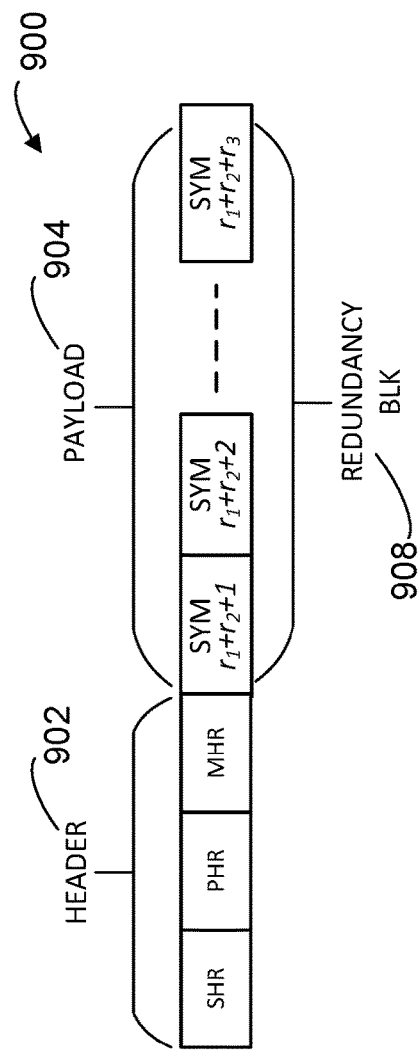
FIG. 9A depicts an example third iteration redundancy packet received by the receiving device upon request to the sending device if the second redundancy packet decoding is not successful, where the decoder input may be as shown in FIG. 9B, according to an embodiment of the present disclosure.
Figure 9B:
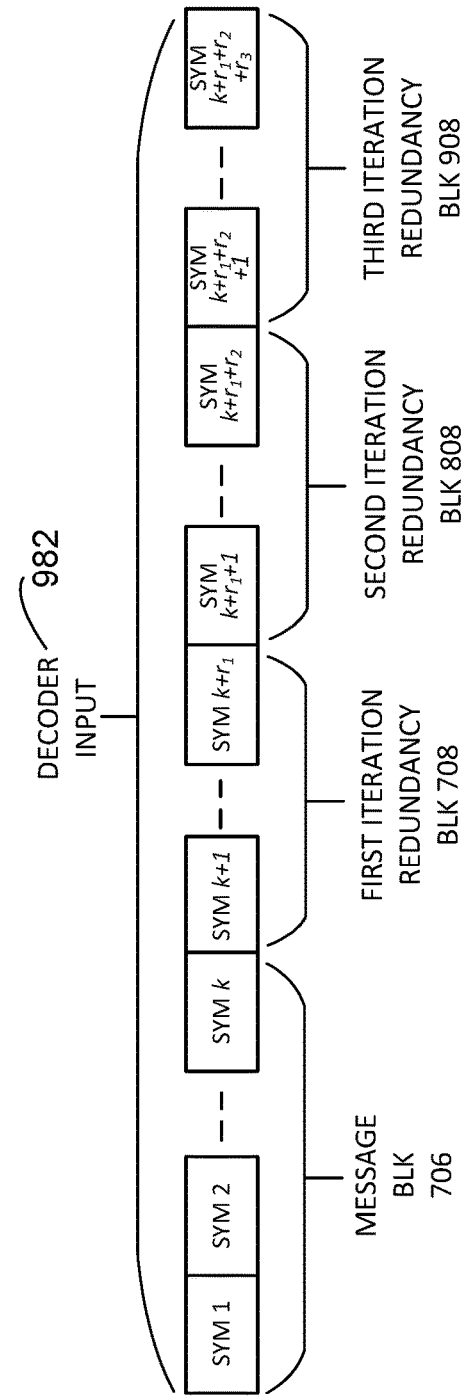

Referring now to FIG. 9A, in response to receiving another request for additional redundancy from receiving device 320, sending device 318 may send another redundancy data packet 900 to receiving device 320. Redundancy packet 900 includes a header 902 and a payload 904 that includes a third iteration redundancy block 908 for message block 706. In a third attempt to decode message block 706, decoder input 982 of FIG. 9B may be used by receiving device 320. As shown in FIG. 9B, for this third iteration, decoder input 982 comprises message block 706, redundancy block 708, redundancy block 808, and redundancy block 908. In an embodiment (and at any iteration of error correction), once errors are corrected, an error detection method may be used to confirm whether the error correction is successful. If decoding of message block 706 by receiving device 320 is successful, receiving device 320 may send to sending device 318 an acknowledgement of successful receipt. If decoding of message block 706 is again not successful, receiving device 320 may send yet another request to sending device 318 for additional redundancy. In an embodiment, this additional request for redundancy may include condition information from the perspective of receiving device 320 that sending device 318 may use to adjust parameters for sending subsequent communications, as discussed above.

In the example given above with regard to data packet 706, three iterations of redundancy are shown. This is only an example and not intended to be a limitation. Any number of redundancy iterations may be used, up to the number of iterative redundancy blocks generated for a given message block. As described earlier, a maximum number of iterations generated may be limited by the chosen codeword length.

In an embodiment, a maximum number of redundancy iteration requests may be set as a threshold. Once the set maximum number of redundancy iteration requests is reached, or once all of the available iterative redundancy blocks have been sent, if the decoding of the message block at receiving device 320 is still not successful, a message may be sent by receiving device 320 to sending device 318 to inform sending device 318 of non-receipt. In an embodiment, sending device 318 may attempt to resend the data packet at some point in the future (e.g., immediately, after a predetermined time period, upon request from receiving device 320, etc.).

Figure 10A:
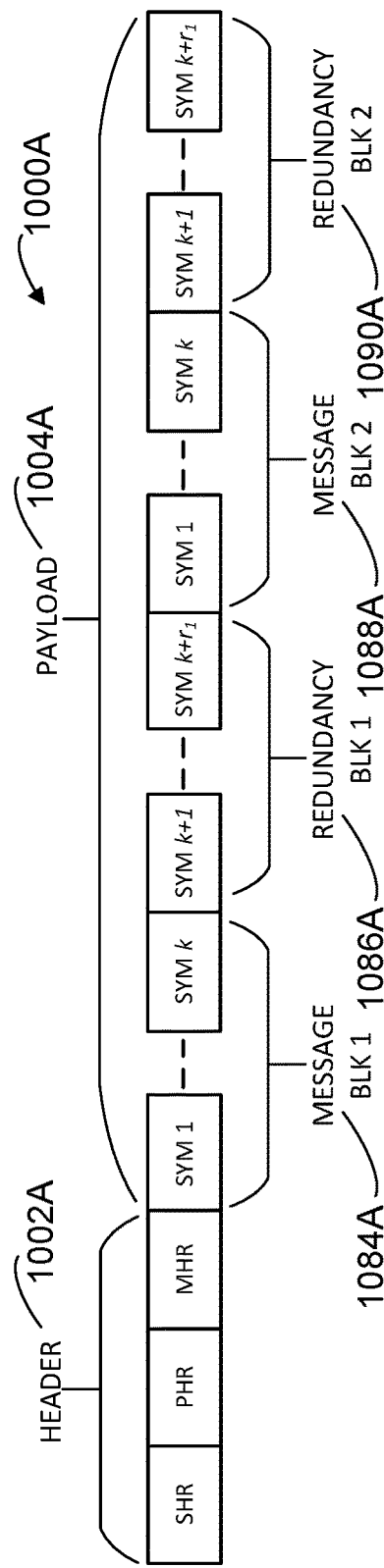
FIGS. 10A and 10B illustrate examples of two-block data packets with interleaved redundancy (FIG. 10A) and end of packet redundancy (FIG. 10B), according to embodiments of the present disclosure.
Figure 10B:
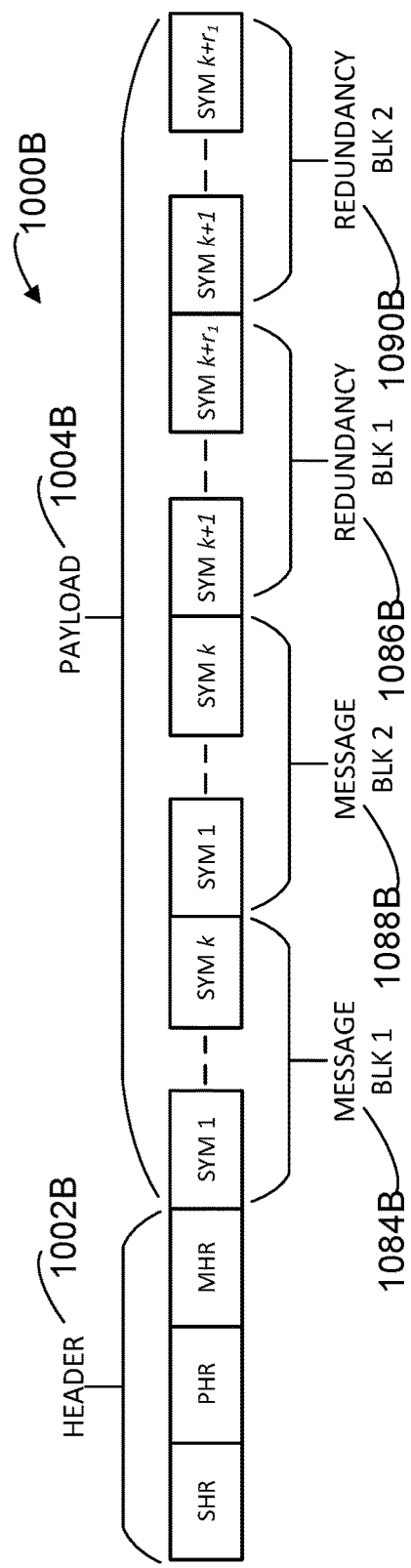

For message blocks that otherwise may be quite long, it may be beneficial to break the message blocks down into several message blocks. FIGS. 10A and 10B are depictions of example two-block data packets—one uses interleaved redundancy (data packet 1000A of FIG. 10A) and one uses end of packet redundancy (data packet 1000B of FIG. 10B), according to embodiments of the present disclosure. Data packet 1000A includes a header 1002A, and a payload 1004A that includes a first message block 1084A followed by a redundancy block 1086A that corresponds to message block 1084A, a second message block 1088A, and a redundancy block 1090A that corresponds to message block 1088A. Data packet 1000B includes a header 1002B, and a payload 1004B that includes a first message block 1084B followed by a second message block 1088B, a first redundancy block 1086B that corresponds to message block 1084B, and a second redundancy block 1090B that corresponds to message block 1088B. Data packet 1000A uses interleaved redundancy, which may provide error correction benefits such as those discussed earlier in this document. Data packet 1000B uses end of packet redundancy, where all of the redundancy blocks are appended after all of the message blocks. This structure has its own unique benefit in that receiving devices that are not intended to utilize the invention described herein may stop listening after the last message block is received. Thus, using end of packet redundancy would allow receiving devices to receive the message block of a given data packet, but could limit the use of the redundancy to only receiving devices that are intended to use it. In this way, and as an example, data packets using end of packet redundancy may be in compliance with one or more messaging standards, but still allow the redundancy techniques described herein to be used by those receiving devices that are intended to use them. In embodiments, a portion of a header of a data packet may indicate to a receiving device 320 how many symbols are present, how many message blocks are present, and/or how may redundancy blocks are appended to the message. In an embodiment, a receiving device 320 that is intended to receive the redundancy blocks may be made aware that it is to receive the redundancy blocks based on a pre-configuration of receiving device 320 (e.g., via configuration manager 356), as described earlier herein.

Figure 10C:
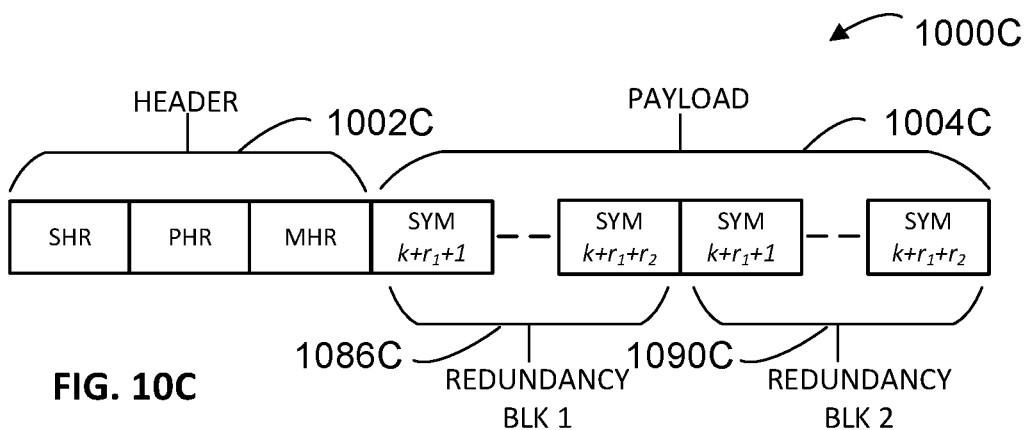
FIG. 10C depicts an example second iteration redundancy packet received by the receiving device upon request to the sending device if initial redundancy packet decoding of a two-block data packet (e.g., of FIG. 10A or FIG. 10B) is not successful, according to an embodiment of the present disclosure.

Each message block of either of the example payloads (1004A or 1004B) may be decoded by receiving device 320 as described above (and would be understood by those of ordinary skill in the art). If decoding of all message blocks by receiving device 320 is successful, receiving device 320 may send to sending device 318 an acknowledgement of successful receipt (optionally after using error detection to confirm the errors were indeed corrected). If decoding of any of the message blocks is not successful (e.g., if a message block is missing, corrupted, empty, etc.), receiving device 320 may send a request to sending device 318 for additional redundancy. In an embodiment, the request for redundancy may include condition information from the perspective of receiving device 320 that sending device 318 may use to adjust parameters for sending subsequent communications, as discussed above. In response to receiving a request for redundancy from receiving device 320, sending device 318 may send a redundancy data packet 1000C (FIG. 10C) to receiving device 320. Redundancy data packet 1000C includes a header 1002C and a payload 1004C that includes second iteration redundancy block 1086C that corresponds to the first message block (1084A or 1084B) and second iteration redundancy block 1090C that corresponds to the second message block (1088A or 1088B).

Figure 10D:
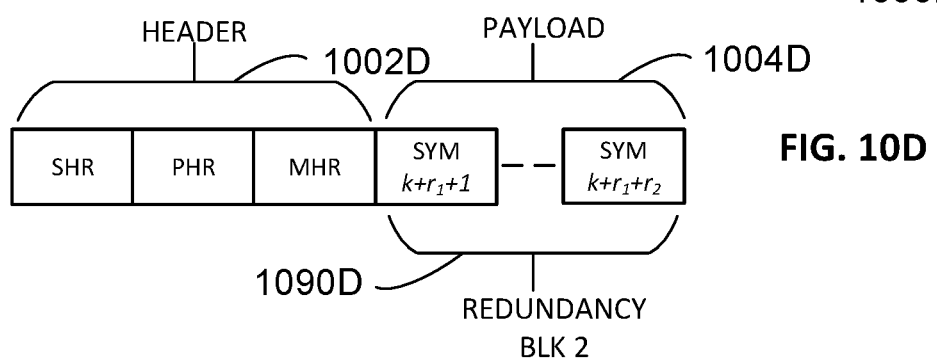
FIG. 10D illustrates an example second iteration redundancy packet received by a receiving device upon request to a sending device if initial redundancy packet decoding of a two-block data packet (e.g., of FIG. 10A or FIG. 10B) is not successful, where a specific block with errors (in this example, Block 2) had been identified, according to an embodiment of the present disclosure.

In an embodiment, receiving device 320 may specifically identify one or more message blocks that could not be successfully decoded, and the request for redundancy sent by receiving device 320 to sending device 318 may include an indication of which message blocks were needed. Following the example regarding data packets 1000A or 1000B, if receiving device 320 determines that only the second message block is needed, receiving device 320 may indicate that in its request for redundancy to sending device 318, and sending device 318 may, in response, send redundancy data packet 1000D (FIG. 10D), which includes a header 1002D and a payload 1004D that includes only a redundancy block 1090D corresponding to the second message block (1088A or 1088B).

Receiving device 320 may then use the received redundancy block(s) to decode the message blocks of data packet 1000A or 1000B. If decoding of all (or the remaining) message blocks by receiving device 320 is successful, receiving device 320 may send to sending device 318 an acknowledgement of successful receipt (optionally after using error detection to confirm the errors were indeed corrected). If decoding of any of the message blocks is still not successful, receiving device 320 may send another request to sending device 318 for additional redundancy, and so on. In an embodiment, a maximum number of redundancy iterations may be available or set as a threshold, as discussed above.

Figure 10E:
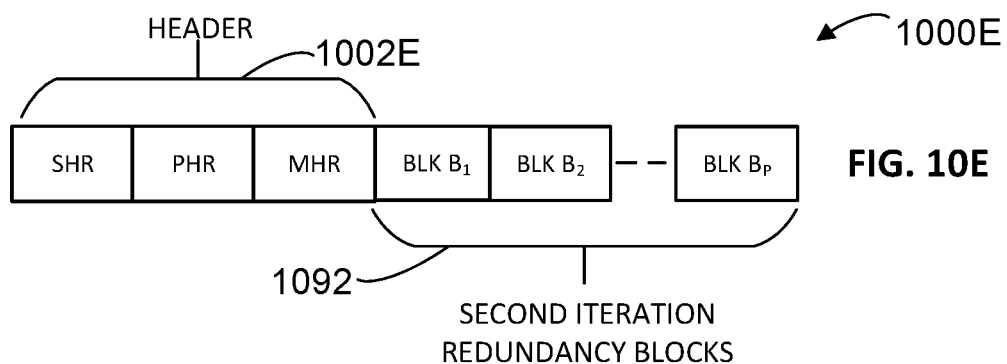
FIGS. 10E and 10F are generalized depictions of example second and third iteration redundancy packets, where the included redundancy blocks are for all message blocks or only the message blocks identified as erroneous, according to embodiments of the present disclosure.
Figure 10F:
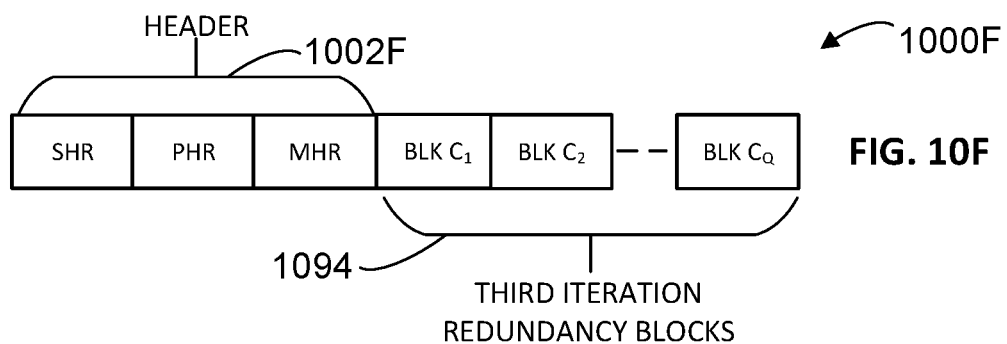

For the example data packets 1000A/1000B, only two message blocks are shown for simplicity and ease of understanding. This is not meant to be a limitation, as any number of message blocks may be included. FIGS. 10E and 10F depict examples of a second iteration redundancy data packet 1000E (including a header 1002E and second iteration redundancy blocks 1092) and a third iteration redundancy packet 1000F (including a header 1002F and third iteration redundancy blocks 1094) that may correspond to a multi-message-block data packet. In an embodiment, blocks 1092 and/or 1094 may include redundancy blocks representing all of the message blocks of the multi-message-block data packet. In another embodiment, blocks 1092 and/or 1094 may include redundancy blocks representing only message blocks of the multi-message-block data packet that were indicated as needed by receiving device 320.

As discussed above, in an embodiment, a receiving device (e.g., 320) may be able to identify which message blocks may need additional redundancy to be repaired via the error correction process described. A receiving device's ability to do so may depend upon the parameters/attributes of the error correction code used, the block length, etc. In some instances, it may be useful to transmit redundancy dedicated to error detection (e.g., using Cyclic Redundancy Check (CRC) or other types of error detection methods) and redundancy dedicated to error correction separately. FIG. 11A depicts an example data packet 1100A that includes a header 1102A and payload 1104A comprising multiple message blocks 1196, and also corresponding detection redundancy blocks 1198 and correction redundancy blocks 1101. In this example, receiving device 320 may decode the error correction code for each block (e.g., conducting the error correction as described earlier herein), and then may use the error detection redundancy to ensure that the errors have been corrected, as discussed above. The decoder input (1103) for a particular message block is shown in FIG. 11B and includes the message block 1105, the corresponding detection redundancy block 1107, and the corresponding error correction redundancy block 1109. In an embodiment, the error detection code may be appended to the message for error correction decoding, as discussed earlier. In this way, errors in the error detection code may be corrected.

If decoding of the message blocks by receiving device 320 is successful, receiving device 320 may send to sending device 318 an acknowledgement of successful receipt, as discussed above. If decoding of any of the message blocks is not successful, receiving device 320 may send a request to sending device 318 for additional redundancy. In an embodiment, the request for redundancy may include condition information from the perspective of receiving device 320 that sending device 318 may use to adjust parameters for sending subsequent communications, as discussed above. In response to receiving a request for redundancy from receiving device 320, sending device 318 may send a redundancy data packet 1100C (FIG. 11C) to receiving device 320. Redundancy data packet 1100C includes a header 1102C and a payload including second iteration redundancy blocks 1111 that correspond to the message blocks 1196 (or, in an embodiment, just the message blocks specified in the request from receiving device 320). In an embodiment, it would not be necessary to include error detection redundancy in redundancy data packet 1100C because the error detection code would be a part of the message, as discussed earlier, and would be corrected through the forward error correction if corrupted, lost, etc. If decoding of any of the message blocks using the second iteration redundancy is still not successful, receiving device 320 may send another request to sending device 318 for additional redundancy, and so on. In an embodiment, a maximum number of redundancy request iterations may be available or set as a threshold, as discussed above.

Figure 12:
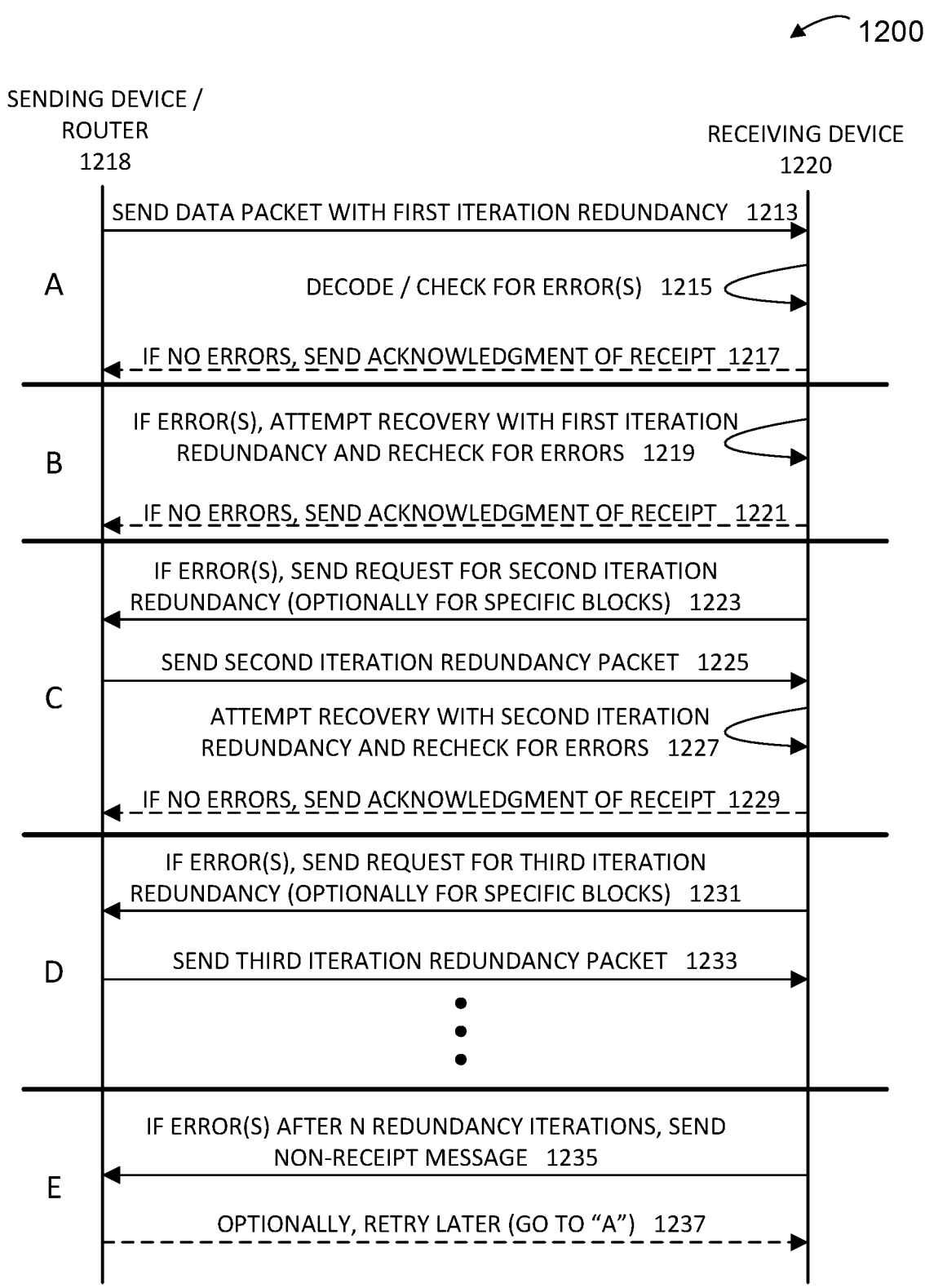
FIG. 12 is a sequence diagram illustrating example data communications between a sending device and a receiving device with error detection and/or correction, according to embodiments of the present disclosure.

FIG. 12 is a sequence diagram 1200 illustrating example data communications between a sending device and a receiving device with error detection and/or correction, according to embodiments of the present disclosure, including those discussed above. For ease of understanding, sequence diagram 1200 is shown broken out into multiple stages A-F. Stage A includes an initial communication where sending device 1218 may send a data packet with first iteration redundancy to receiving device 1220 (1213). Receiving device 1220 may decode message blocks of the data packet and check for errors (1215), as described earlier herein. Receiving device 1220 may know (e.g., based on information from the message header, and/or via pre-configuration) how many data segments/symbols (e.g., how many message blocks or symbols) are in the data packet. Receiving device 1220 may then determine the number of redundancy symbols to expect appended at the end of the data packet and may receive those appended symbols. If there are no errors (i.e., the message blocks were successfully received), receiving device 1220 may send an acknowledgment of successful receipt to sending device 1218 (1217). Stage B continues with first iteration error correction. If there were errors upon the initial decoding effort (1215), error correction may be attempted with the first iteration redundancy included with the initial data packet (1219). In an embodiment (and at any iteration of error correction), once errors are corrected, an error detection method may be used to confirm whether the error correction is successful. If the error correction is successful, receiving device 1220 may send an acknowledgment of successful receipt to sending device 1218 (1221). Stage C continues with second iteration error correction. If there were uncorrected errors upon the first iteration decoding effort (1219), receiving device 1220 may send a request to sending device 1218 for second iteration redundancy (1223). In an embodiment, the request may include a request for redundancy blocks for specifically identified message blocks (e.g., only those that contain errors), as discussed above. Sending device 1218 may send receiving device 1220 a second iteration redundancy data packet (1225), as discussed above. Error correction may then be attempted with the second iteration redundancy data (1227). In an embodiment (and at any iteration of error correction), once errors are corrected, an error detection method may be used to confirm whether the error correction is successful. If the error correction is successful, receiving device 1220 may send an acknowledgment of successful receipt to sending device 1218 (1229). If there were uncorrected errors upon the second iteration decoding effort (1227), receiving device 1220 may send a request to sending device 1218 for third iteration redundancy (1231). In an embodiment, the request may include a request for redundancy blocks for specifically identified message blocks (e.g., only those that contain errors), as discussed above. Sending device 1218 may send receiving device 1220 a third iteration redundancy data packet (1233), as discussed above. Stage D may then continue with third iteration error checking using the third redundancy data, etc., similar to the second iteration error checking of stage C. In an embodiment, a maximum number of error correction iterations (N) may be available or set as a threshold, such that in stage E, if there are still uncorrected errors after N redundancy iterations, a message of non-receipt may be sent from receiving device 1220 to sending device 1218 (1235). Optionally, sending device 1218 may retry sending to receiving device 1220 the original data packet with first iteration redundancy (1237) (and may restart the process at stage A) (e.g., immediately, after a predetermined amount of time, at the request of receiving device 1220, etc.).

Figure 13:
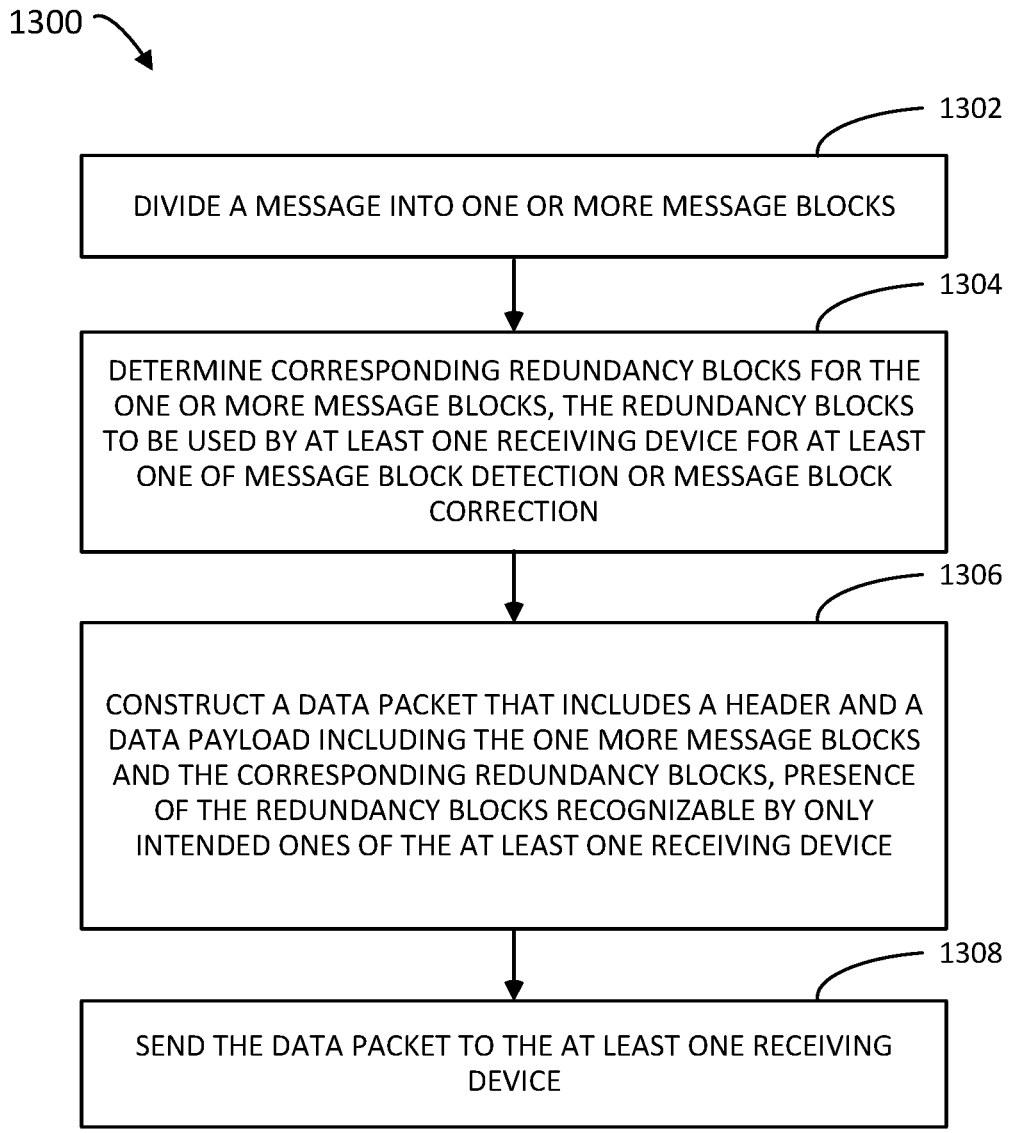
FIGS. 13 and 14 are flow diagrams illustrating an example data communication method from the perspective of a sending device, according to embodiments of the present disclosure.
Figure 14:
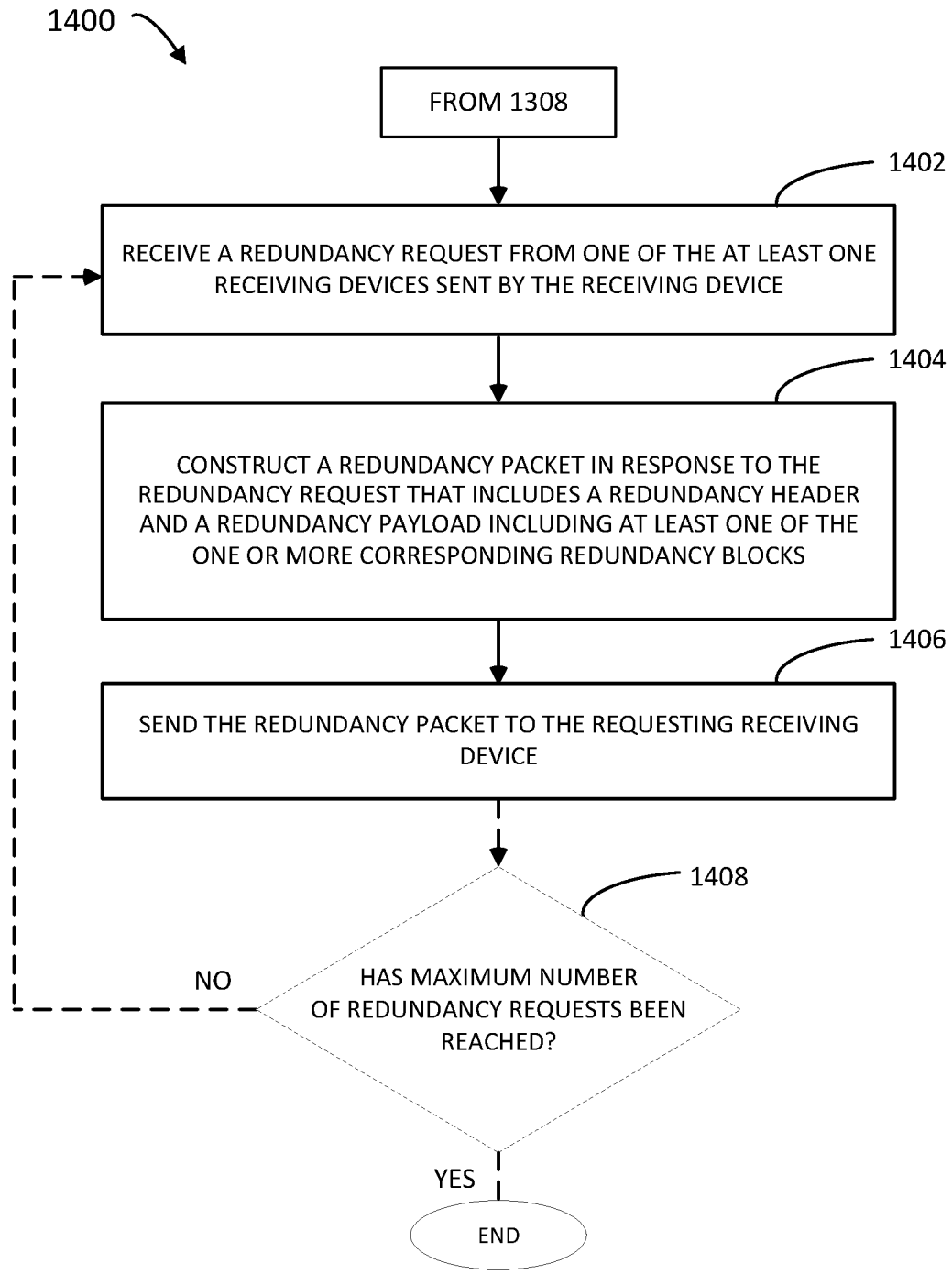

FIGS. 13 and 14 are flow diagrams illustrating an example data communication method from the perspective of a sending device, according to embodiments of the present disclosure. FIG. 13 is an example process 1300 of generating a data packet (e.g., via data packet generator 348 and/or processor(s) 342 of FIG. 3) in accordance with embodiments of the present disclosure. At 1302, a message may be divided into one or more message blocks. At 1304, corresponding redundancy blocks for the one or more message blocks may be determined, the redundancy blocks comprising error detection code and/or error correction code to be used by at least one receiving device for message block detection and/or correction. At 1306, a data packet may be generated that includes a header and a data payload including the one or more message blocks and the corresponding redundancy blocks, where presence of the redundancy blocks will be recognizable only by intended receiving devices of the at least one receiving device. In an embodiment, the data packet may include one or more selected ones of the corresponding redundancy blocks. In an embodiment, the header information may include an indication of how many message blocks and/or how many redundancy blocks are in the data payload. At 1308, the constructed data packet may be sent to the at least one receiving device.

FIG. 14 is an example process 1400 of handling (by a sending device) a redundancy request from a receiving device that was not able to successfully decode a data packet sent from the sending device (e.g., in 1308 of process 1300), according to embodiments of the present disclosure. At 1402, a redundancy request may be received from a receiving device. At 1404, a redundancy packet may be constructed that includes a redundancy header and a redundancy payload including at least one of the one or more corresponding redundancy blocks. In one embodiment, a redundancy payload may include all of the message blocks of the original message. In another embodiment, the redundancy request may specify which of the message blocks were erroneous, and the redundancy payload in the redundancy packet may include only redundancy blocks that correspond to the specified erroneous message blocks. At 1406, the redundancy packet may be sent to the requesting receiving device. According to an embodiment, the redundancy request may include information regarding network conditions that may indicate to sending device 318/1218 that communication parameters may need to be changed for subsequent messages. In an optional embodiment, at 1408, it may be determined whether a maximum number of redundancy requests has been reached. In embodiments, the number of additional redundancy requests may be limited to the available number of iterations or a predetermined threshold amount of additional redundancy requests. If the maximum number of redundancy requests has not been reached, process 1400 continues back at 1402, where further redundancy requests may be received and processed.

Figure 15:
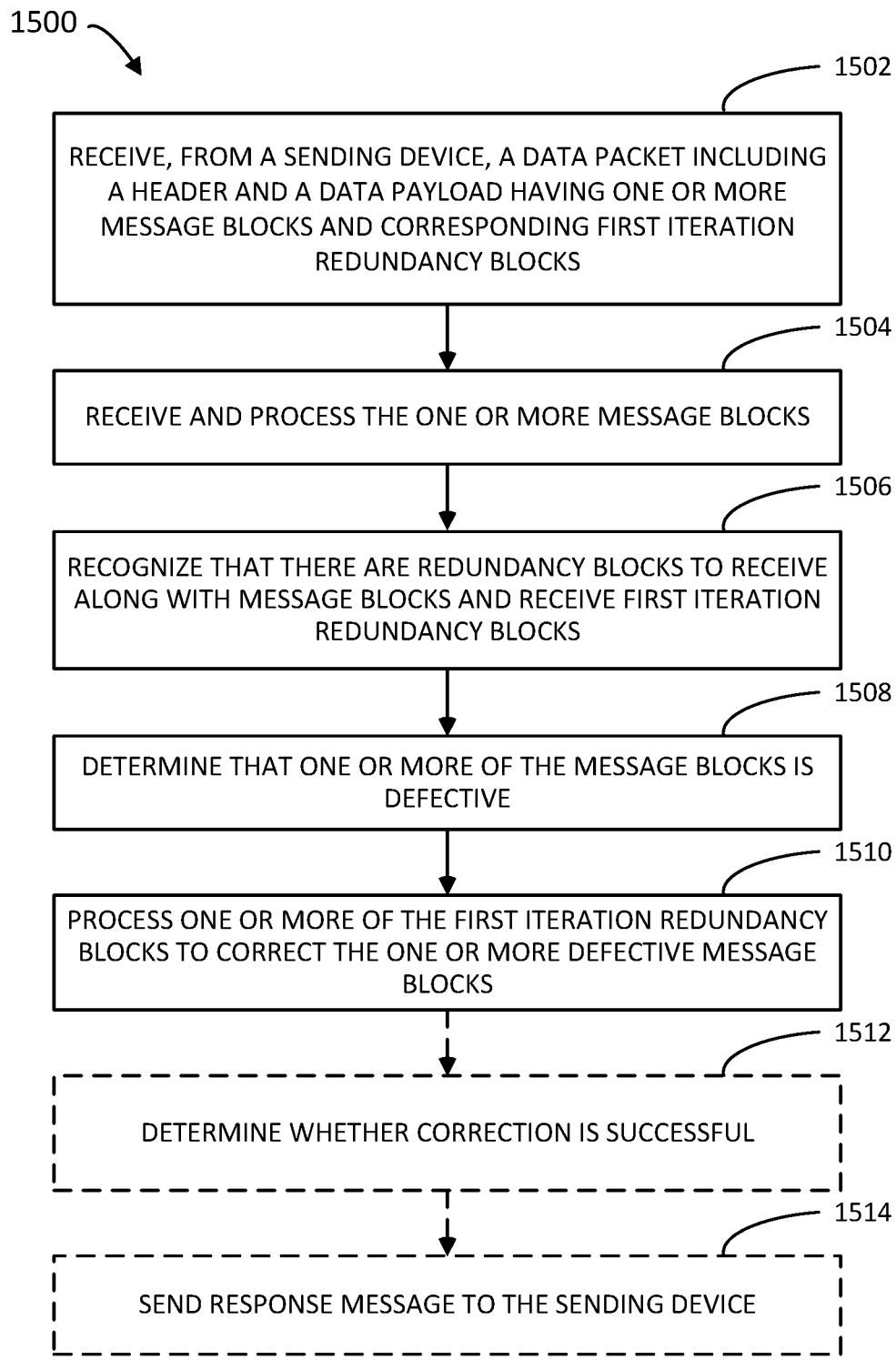
FIGS. 15 and 16 are flow diagrams illustrating an example data communication method from the perspective of a receiving device, according to embodiments of the present disclosure.

FIG. 15 is an example process 1500 of receiving a data packet at a receiving device 320/1220, in accordance with embodiments of the present disclosure. At 1502, a data packet sent from a sending device (e.g., sending device 318/1218) may be received by a receiving device (e.g., receiving device 320/1220, via communication system/interface 354 of FIG. 3). The data packet may include a header and a data payload having one or more message blocks and one or more corresponding redundancy blocks. At 1504, the one or more message blocks may be read in from the received data packet. At 1506, receiving device 320/1220 may recognize that there are redundancy blocks to expect/receive along with the message blocks and may read in the redundancy blocks. Receiving device 320/1220 may be pre-configured (e.g., via configuration manager 356) to recognize that the data packet contains redundancy blocks corresponding to the one or more message blocks. In an embodiment, receiving device 320/1220 may be able to determine how many redundancy blocks to expect based on, for example, the packet length (e.g., provided in the data packet header information) and block size (e.g., provided in the data packet header information or via pre-configuration of the receiving device).

At 1508, receiving device 320/1220 (e.g., via processor(s) 350) may determine that one or more of the message blocks is defective (e.g., corrupted, missing, etc.), which may be done in a manner known or understood by one of ordinary skill in the relevant art. At 1510, one or more of the received redundancy blocks may be used to correct the one or more defective message blocks (e.g. in a manner known or understood by one of ordinary skill in the relevant art). Optionally, at 1512, receiving device 320/1220 may determine whether the error correction is successful (e.g., via a known error detection method). Also optionally, at 1514, a response message may be sent to sending device 318/1218 from receiving device 320/1220. If all of the one or more defective message blocks were successfully corrected, the response message may include an indication to sending device 318/1218 that all of the message blocks of the data packet were received successfully. If one or more of the defective message blocks could not be corrected, the response message may include a request for one or more redundancy blocks to be used to correct the defective message block(s). In an embodiment, the redundancy request may indicate specifically which message blocks were defective and/or which redundancy blocks were needed. According to an embodiment, the response message may include information regarding network conditions that may indicate to sending device 318/1218 that communication parameters may need to be changed for subsequent messages.

Figure 16:
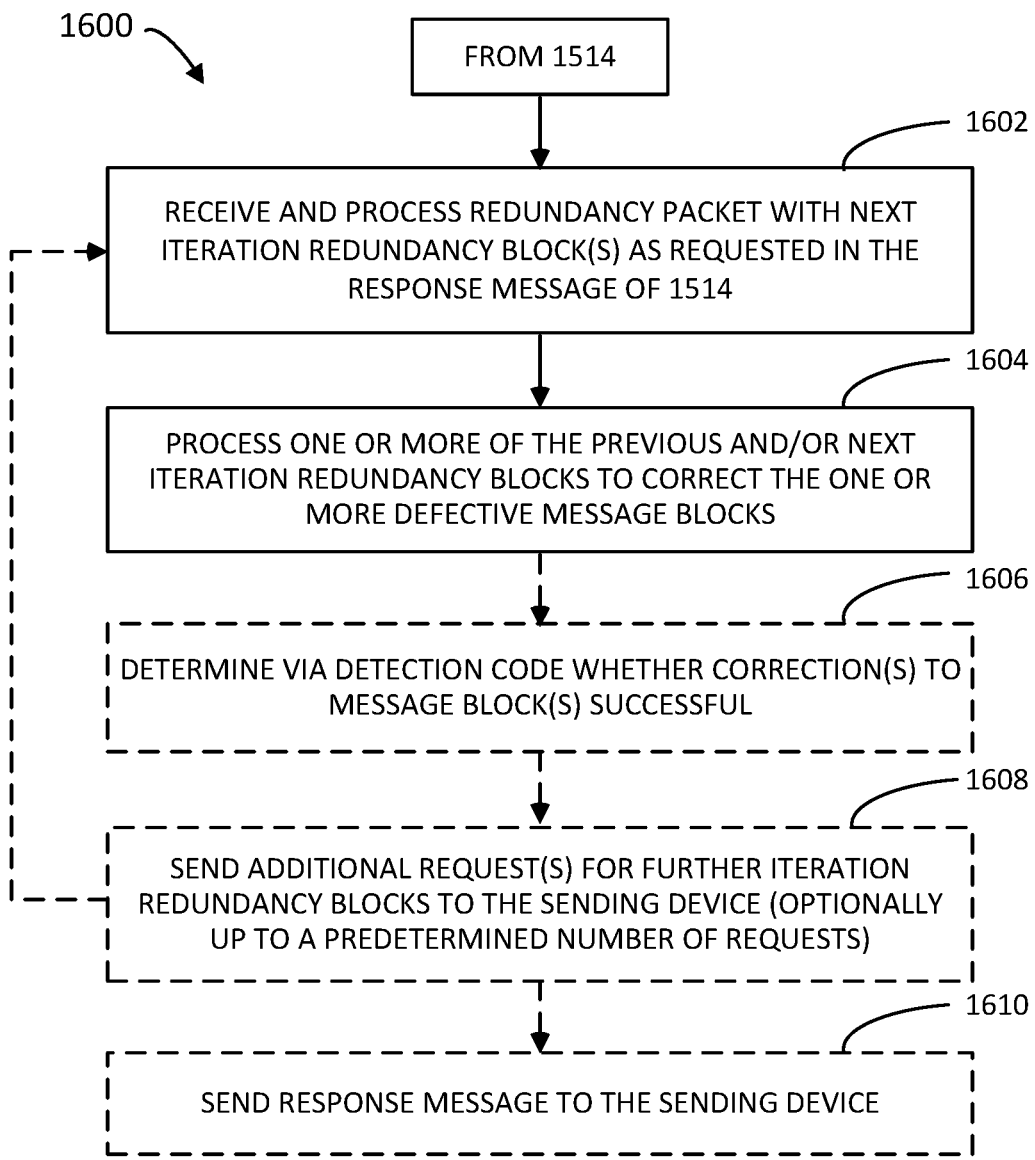

FIG. 16 is an example process 1600 of receiving a redundancy packet sent from a sending device (e.g., in 1406 of FIG. 14), in accordance with embodiments of the present disclosure. At 1602, a redundancy packet may be received by receiving device 320/1220 with one or more redundancy blocks as requested in the response message of 1514 (FIG. 15). The one or more redundancy blocks may include redundancy blocks for all message blocks of the original message, for a subset of the message blocks of the original message, or for specific message blocks of the original message (as may have been specified in the redundancy request, for example). At 1604, one or more of the received redundancy blocks may be processed (e.g., by processor(s) 350) to correct the one or more defective message blocks. At 1606, it may optionally be determined (e.g., via a known error detection code) whether correction(s) to the message block(s) were successful. If one or more of the defective message blocks could not be corrected, in an embodiment, at optional action 1608, receiving device 320/1220 may send an additional redundancy request for one or more redundancy blocks to sending device 318/1218, with the process repeating again starting at 1602. In an embodiment, additional redundancy requests may be made up to a predetermined number of requests (e.g., up to a predetermined threshold number of requests, up to the number of available redundancy iterations, etc.). Optionally, at 1610, a response message may be sent by receiving device 320/1220 to sending device 318/1218. If all of the one or more defective message blocks were corrected, the response message may include an indication to sending device 318/1218 that all of the message blocks of the data packet were received successfully. If one or more of the defective message blocks could still not be corrected, the response message may indicate to sending device 318/1218 that one or more of the message blocks were not received successfully. Optionally, the response message may request a resend of the original message (e.g., immediately, after a period of time, etc.), after which processes 1500 and 1600 may be repeated. According to an embodiment, the response message may include information regarding network conditions that may indicate to sending device 318/1218 that communication parameters may need to be changed for subsequent messages.

Example Environment(s)/Device(s)

Figure 17:
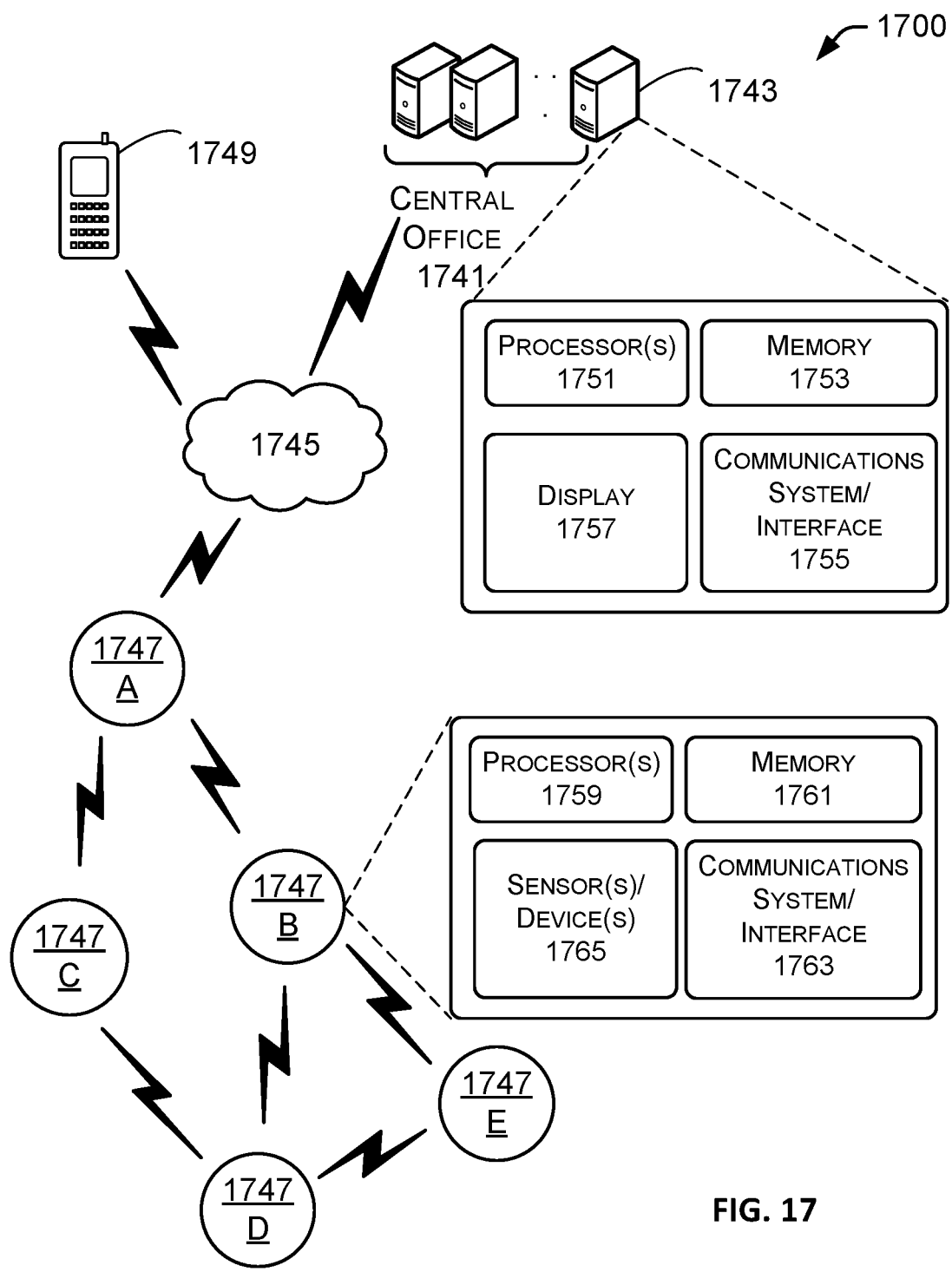
FIG. 17 is an illustration of an example network environment in which example methods, apparatus, and articles of manufacture disclosed herein may be implemented, according to embodiments of the present disclosure.

FIG. 17 is an illustration of an example network environment in which methods, apparatus, and articles of manufacture disclosed herein may be implemented, according to embodiments of the present disclosure. For example, sending device (or node) 318/1218 and/or receiving device (or node) 320/1220 may be a part of an advanced communication system (e.g., an advanced meter reading (AMR) network or an advanced metering infrastructure (AMI) network, of a utility related application), such as data collection network 1700 of FIG. 17, according to embodiments. Data collection network 1700 may include a central office 1741, which may be associated with a data collection/processing entity (e.g., a utility company, in the case of an AMR or AMI network). The central office may include one or more central computing device(s) 1743 that may communicate with network nodes through one or more networks 1745, which may be the Internet or other network having widespread or local functionality. Network nodes may include nodes 1747A-1747E (collectively, nodes 1747), which may include, for example, endpoint devices such as utility meters (e.g., gas meters, water meters, electric meters, etc.) or other devices that may comprise sensors, actuators, etc. These nodes may be located at various locations (e.g., homes, businesses, etc.). Nodes 1747A-1747E may be configured in a mesh network, star network or other configuration. While only five nodes 1747 are illustrated for simplicity, there may be any number of network nodes. One or more of the network nodes (e.g., device 1747A) may be a data collector and/or concentrator that may be configured for communication (e.g., radio frequency (RF) communication, cellular communication, etc.) with a plurality of downstream nodes 1747B-1747E, which may also be configured for similar communications. In an example operation, data collector 1747A may send and/or receive data or other communications to and/or from nodes 1747B-1747E to be provided to a data collection device 1743 (which may be located at central office 1741) and/or a mobile data collection device 1749. For example, in an AMR or AMI network, data collector 1747A may collect data from nodes 1747B-1747E that may include consumption data or other information associated with a utility meter (e.g., a gas meter, a water meter, an electricity meter, etc.). Additionally, data collector 1747A may send software updates, firmware updates, instructions or other information (which may have been communicated to data collector 1747A from data collection device 1743 or 1749, for example) to one or more of the nodes 1747B-1747E. In an embodiment, one or more network nodes (e.g., nodes 1747A-1747E) may be powered by a battery.

In an expanded view, data collection device 1743 (and/or mobile data collection device 1749) may include, among other components, one or more controllers or processors 1751, a memory 1753, one or more communication system and/or interfaces 1755 (e.g., configured for RF communications, cellular communications, and/or another type of communications), and optionally a display 1757. Nodes 1747 may include, among other components, one or more controllers or processors 1759, a memory 1761, one or more communication systems and/or interfaces 1763 (e.g., configured for RF communications, cellular communications, and/or another type of communications), and one or more sensors/devices 1765, which may include, for example, one or more measurement sensors or other devices (e.g., meter(s), actuator(s), light(s), etc.). Data collection device 1743 (and/or mobile data collection device 1749), as well as each node 1747, may be a sending device (318/1218), a receiving device (320/1220), or both.

One or more features disclosed herein may be implemented in hardware, software, firmware, and/or combinations thereof, including discrete and integrated circuit logic, application specific integrated circuit (ASIC) logic, and microcontrollers, and may be implemented as part of a domain-specific integrated circuit package, or a combination of integrated circuit packages. The terms software and firmware, as may be used herein, refer to a computer program product including at least one computer readable medium having computer program logic, such as computer-executable instructions, stored therein to cause a computer system to perform one or more features and/or combinations of features disclosed herein. The computer readable medium may be transitory or non-transitory. An example of a transitory computer readable medium may be a digital signal transmitted over a radio frequency or over an electrical conductor, through a local or wide area network, or through a network such as the Internet. An example of a non-transitory computer readable medium may be a compact disk, a flash memory, SRAM, DRAM, a hard drive, a solid state drive, or other data storage device.

A processing platform of a data collection device (e.g., data collection device 1743 or mobile data collection device 1749 of FIG. 17), and/or a node (e.g., any of devices 1747) may be embodied in any type of mobile and/or non-mobile computing device. Examples of mobile devices may include, but are not to be limited to, laptop computers, ultra-laptop computers, tablets, touch pads, portable computers, hand-held computers, palmtop computers, personal digital assistants (PDAs), e-readers, cellular telephones, combination cellular telephone/PDAs, mobile smart devices (e.g., smart phones, smart tablets, etc.), mobile internet devices (MIDs), mobile messaging devices, mobile data communication devices, mobile media playing devices, cameras, mobile gaming consoles, wearable devices, mobile industrial field devices, etc. Examples of non-mobile devices may include, but are not to be limited to, servers, personal computers (PCs), Internet appliances, televisions, smart televisions, data communication devices, media playing devices, gaming consoles, industrial field devices (e.g., utility meters or other sensors or devices), etc.

Figure 18:
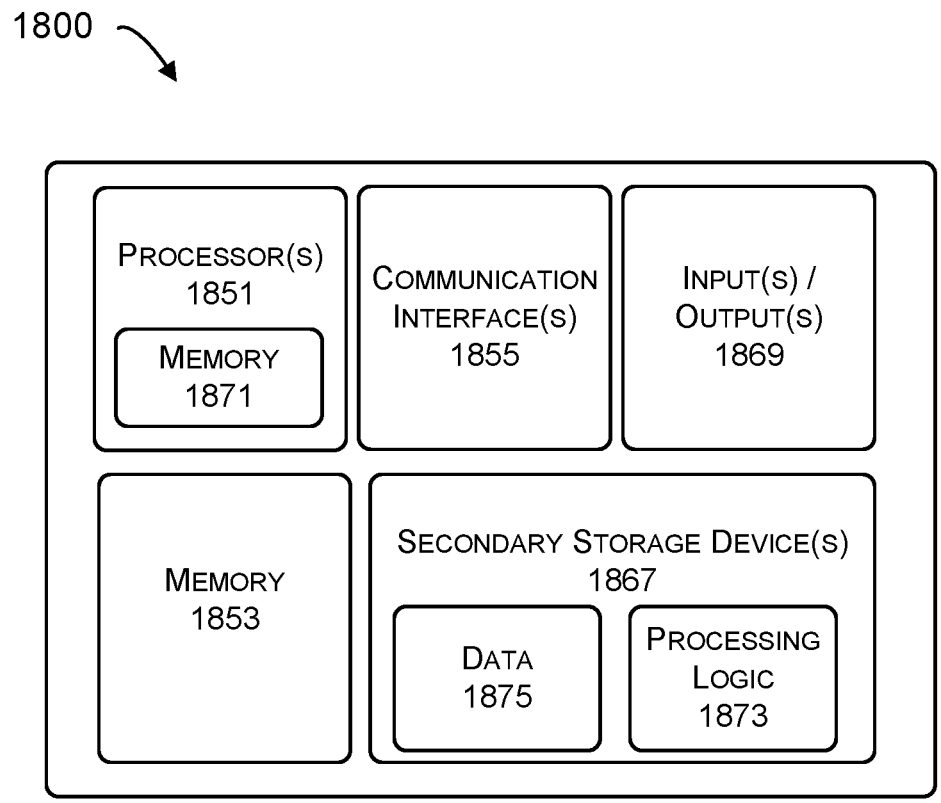
FIG. 18 is a block diagram showing various components of an example data collection device (e.g., device 1743 or device 1749 of FIG. 17), according to an embodiment of the present disclosure.

FIG. 18 is a block diagram of an example processing platform 1800 of a mobile or non-mobile data collection device (e.g., device(s) 318/1218, 320/1220, 1743, 1749), according to embodiments. A data collection device may act as a sending device and/or a receiving device in the context of this disclosure. Processing platform 1800 may include one or more processors 1851, memory 1853, one or more secondary storage devices 1867, one or more input/output ports or devices 1869, and/or one or more communication interfaces 1855, in communication via a bus, line, or similar implementation (not shown). Processing platform 1800 may also include a power supply (not shown), which may include an interface to an electricity source and/or may include one or more batteries.

Processor(s) 1851 may be implemented by, for example but not limitation, one or more integrated circuits, logic circuits, microprocessors, controllers, etc. Processor(s) 1851 may include a local memory 1871 (e.g., a cache). Memory 1853 may include a volatile and/or a non-volatile memory. Volatile memory may be implemented by, for example but not limitation, Synchronous Dynamic Random Access Memory (SDRAM), Dynamic Random Access Memory (DRAM), and/or any other type of random access memory device. Non-volatile memory may be implemented by flash memory and/or any other desired type of memory device. Access to memory 1853 may be controlled by a memory controller (not shown). Data stored in memory 1853 and/or local memory 1871 may be used by processor(s) 1851 to facilitate data collection functions and/or communications, calculations/computations (e.g., if not done at the node device(s) or elsewhere), etc., according to embodiments of this disclosure.

Input/output port(s)/device(s) 1869 may allow a user or an external device to interface with processor(s) 1851. Input devices may allow a user to enter data and/or commands for processor(s) 1851. Input devices may include, for example, an audio sensor, a microphone, a camera (e.g., still, video, etc.), a keyboard, a button, a mouse, a touchscreen, a track-pad, a trackball, isopoint, a voice recognition system, etc. Output devices may provide or present information to a user. Output devices may include, for example, display devices such as display device 1757. Examples of other display devices may include a light emitting diode (LED), an organic light emitting diode (OLED), a liquid crystal display, a cathode ray tube display (CRT), a touchscreen, a tactile output device, a printer, speakers, etc. The input/output port(s)/device(s) may be connected to processor(s) 1851, for example, with an interface circuit (not shown). The interface circuit may be implemented by any type of interface standard, such as, for example, an Ethernet interface, a universal serial bus (USB), a PCI express interface, etc. For use with an output device, the interface circuit may include a graphics driver card, chip, and/or processor.

Communication interface(s) 1855 may be implemented in hardware or a combination of hardware and software, and may provide wired or wireless network interface(s) to one or more networks, such as network(s) 1745 of FIG. 17. Communication interface(s) 1855 may be a part of, or connected with, the interface circuit discussed above, and/or may include or connect with communication devices such as a transmitter, a receiver, a transceiver, a modem and/or network interface card to facilitate exchange of data with external devices via a network, such as network(s) 1745. In an embodiment, security mechanisms may be used to provide secure communications, as would be understood by one of ordinary skill in the art.

Secondary storage device(s) 1867 may store processing logic 1873 (e.g., software) to be executed by processor(s) 1851, and/or may store data 1875. Processing logic 1873 and data 1875 may be used by processor(s) 1851 to facilitate data collection functions and/or communications between devices, calculations/computations (e.g., if not done at the node device(s) or elsewhere), etc., according to embodiments of this disclosure. Processing logic 1873 may include instructions for executing the methodology described herein for data communications, for example, which may also include data packet generation and/or configuration management. Examples of secondary storage device(s) 1867 may include one or more hard drive disks, compact disk (CD) drives, digital versatile disk (DVD) drives, Blu-ray disk drives, redundant array of independent disks (RAID) systems, floppy disk drives, flash drives, etc. Data and/or processing logic may be stored on a removable tangible computer readable storage medium (e.g., a floppy disk, a CD, a DVD, a Blu-ray disk, etc.) using one or more of the secondary storage device(s) 1867.

Figure 19:
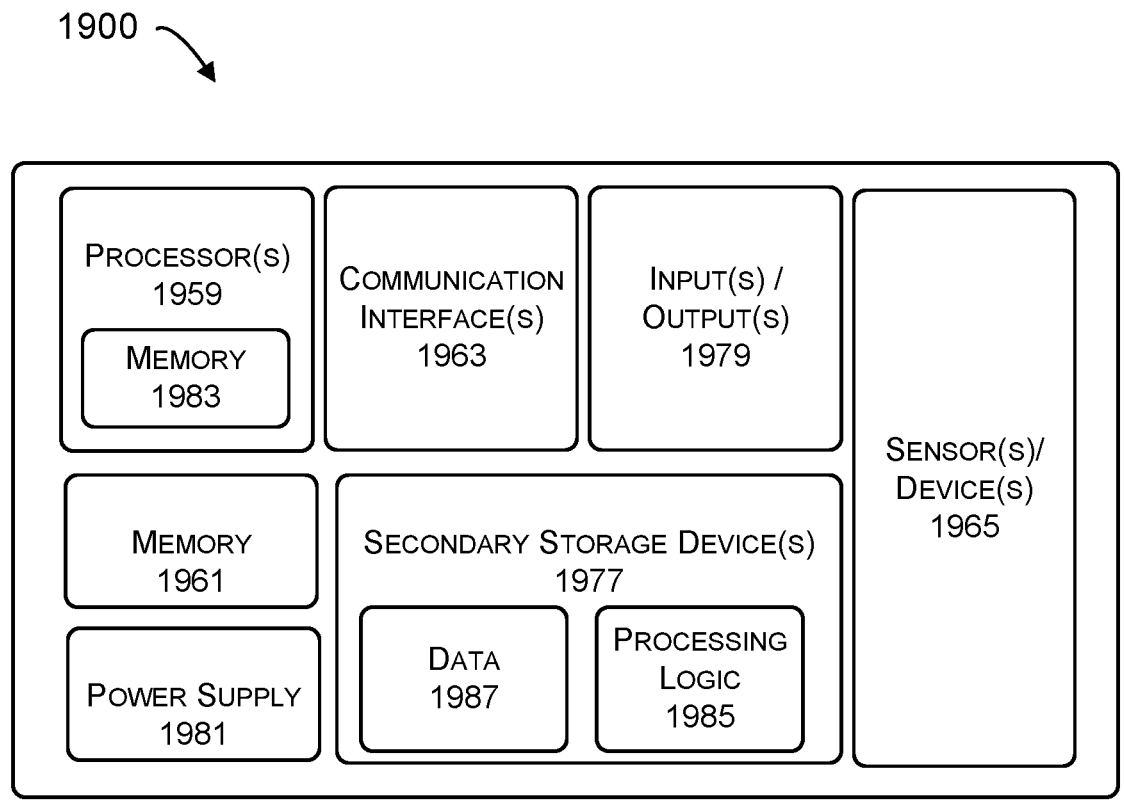
FIG. 19 is a block diagram showing various components of an example network node (e.g., one of devices 1747 of FIG. 17), according to an embodiment of the present disclosure.

FIG. 19 is a block diagram of an example processing platform 1900 of a node device (e.g., node 318/1218, 320/1220, 1747, etc.), according to embodiments. A node device may act as a sending device and/or a receiving device in the context of this disclosure. Processing platform 1900 may include one or more processors 1959, memory 1961, one or more secondary storage devices 1977, one or more input/output ports or devices 1979, and/or one or more communication interfaces 1963, in communication via a bus, line, or similar implementation (not shown). Processing platform 1900 may also include a power supply 1981, which may include an interface to an electricity source and/or may include one or more batteries. Platform 1900 may also include one or more sensors/devices 1965, which may include, for example, one or more measurement sensors or other devices (e.g., meter(s), actuator(s), light(s), etc.).

Processor(s) 1959 may be implemented by, for example but not limitation, one or more integrated circuits, logic circuits, microprocessors, controllers, etc. Processor(s) 1959 may include a local memory 1983 (e.g., a cache). Memory 1961 may include a volatile and/or a non-volatile memory. Volatile memory may be implemented by, for example but not limitation, Synchronous Dynamic Random Access Memory (SDRAM), Dynamic Random Access Memory (DRAM), and/or any other type of random access memory device. Non-volatile memory may be implemented by flash memory and/or any other desired type of memory device. Access to memory 1961 may be controlled by a memory controller (not shown). Data stored in memory 1961 and/or local memory 1983 may be used by processor(s) 1959 to facilitate data collection functions, calculations/computations, metering functions and/or metering calculations/computations (if embodied in a utility meter), and/or communications, etc., according to embodiments of this disclosure.

Input/output port(s)/device(s) 1979 may allow a user or an external device to interface with processor(s) 1959. Input devices may allow a user to enter data and/or commands for processor(s) 1959. Input devices may include, for example, an audio sensor, a microphone, a camera (e.g., still, video, etc.), a keyboard, a button, a mouse, a touchscreen, a track-pad, a trackball, isopoint, a voice recognition system, etc. Output devices may provide or present information to a user. Output devices may include, for example, display devices (e.g., a light emitting diode (LED), an organic light emitting diode (OLED), a liquid crystal display, a cathode ray tube display (CRT), a touchscreen, a tactile output device, a printer, speakers, etc.). The input/output port(s)/device(s) 1979 may be connected to processor(s) 1959, for example, with an interface circuit (not shown). The interface circuit may be implemented by any type of interface standard, such as, for example, an Ethernet interface, a universal serial bus (USB), a PCI express interface, etc. For use with an output device, the interface circuit may include a graphics driver card, chip, and/or processor.

Communication interface(s) 1963 may be implemented in hardware or a combination of hardware and software, and may provide wired or wireless network interface(s) to one or more networks, such as network(s) 1745 of FIG. 17. Communication interface(s) 1963 may be a part of, or connected with, the interface circuit discussed above, and/or may include or connect with communication devices such as a transmitter, a receiver, a transceiver, a modem and/or network interface card to facilitate exchange of data with external devices via a network, such as network(s) 1745. In an embodiment, security mechanisms may be used to provide secure communications, as would be understood by one of ordinary skill in the art.

Secondary storage device(s) 1977 may store processing logic 1985 (e.g., software) to be executed by processor(s) 1959, and/or may store data 1987. Processing logic 1985 and data 1987 may be used by processor(s) 1959 to facilitate sensor data collection functions, metering functions and/or metering calculations/computations if embodied in a utility meter, and/or communications between devices, etc., according to embodiments of this disclosure. Processing logic 1985 may include instructions for executing the methodology described herein, which may also include data packet generation and/or configuration management. Examples of secondary storage device(s) 1977 may include one or more hard drive disks, compact disk (CD) drives, digital versatile disk (DVD) drives, Blu-ray disk drives, redundant array of independent disks (RAID) systems, floppy disk drives, flash drives, etc. Data and/or processing logic may be stored on a removable tangible computer readable storage medium (e.g., a floppy disk, a CD, a DVD, a Blu-ray disk, etc.) using one or more of the secondary storage device(s) 1977.

The foregoing description discloses message correction techniques that may be used to dynamically optimize data transmissions while avoiding the downsides of the approaches currently used. The technology described herein provides efficient data correction and improved data transmission optimization with increased network capacity and minimization of processing time (even in the presence of interference), while maintaining adherence to a communication standard. These optimized error-correction techniques are more efficient than current standard-specified methods, and can more effectively deal with interference. Significantly less data is required to be sent for retry (e.g., to correct only the portions that are corrupted). In addition, the provided redundancy information may be reused (e.g., second iteration FEC decoding may use the provided second iteration redundancy symbols as well as the previously provided first iteration redundancy symbols), even if corrupted from failed transmission attempts. The techniques described herein can dynamically adjust to changes in the network and/or communication link conditions (e.g., by adjusting modulation and/or data rates based on feedback from a receiving device) and can handle rapid variations in interference levels.

Further embodiments other than those described herein may include further variation. For example, in many of the embodiments described herein the message block and redundancy block sizes are static. However, in some embodiments, the message block and redundancy block sizes may be dynamically variable (e.g., based on recent history and/or information provided by a receiving device). In other embodiments, the size of each message block and corresponding redundancy block (and other communication parameters, including those mentioned herein) may be set on a per channel setting basis, as interference may be significantly different per channel. As mentioned herein, in some embodiments, the use of redundancy blocks may not be used at all in the initial message, forcing a request for redundancy blocks if errors are detected.

While the embodiments described herein are primarily directed to unicast messaging, the concepts detailed herein may be extended to multicast messaging as well. Receiving devices that receive multicast messages may also respond with a request for redundancy. In this multicast scenario, a larger window of time may be allowed for contention management of multiple destination (receiving) devices that may require further redundancy (e.g., to ensure enough time for the message to reach the receiving devices and to allow the receiving devices to respond). In an embodiment, receiving devices that need to send a request for redundancy may randomize these requests across a portion of that window of time (e.g., to avoid collisions). In a further embodiment, the position of the portion of the window of time to be used may be proportional to the number of message blocks that could not be corrected (e.g., the more corrupted blocks, the earlier the portion in the window). In this manner, the earlier requested redundancy communications that are multicast back out to the receiving devices may reach, and be used by, more receiving devices than just the requester. This may reduce, or even eliminate, the need for receiving devices with less corrupted blocks to request further redundancy.

The particular examples used in this document are for ease of understanding and are not to be limiting. Though at times described for use directed to utility metering (e.g., of gas, water, electricity, etc.), features described herein may be used in many other contexts that may or may not involve utility metering (e.g., various communication systems (including those that involve ISM bands, for example), IoT applications, WSN networks, etc.). As would be understood by one of ordinary skill in the art, the time and resource-saving features discussed herein may be beneficial in many other systems involving communications (e.g., industrial manufacturing, mining, agriculture, transportation, etc.), including in fields yet unknown.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A device configured to send communications with dynamic data correction, the device comprising:
   a processor;
   a transceiver communicably coupled with the processor, the transceiver configured to communicate with at least one receiving device over a network; and
   a memory communicably coupled with the processor, the memory storing instructions that, when executed by the processor, direct the processor to:
      divide a message into one or more message blocks;
      determine corresponding redundancy blocks for the one or more message blocks, the redundancy blocks to be used by at least one of the receiving devices for at least one of message block detection or message block correction;
      construct a data packet, the data packet including:
         a header; and
         a data payload, the data payload including the one or more message blocks and the corresponding redundancy blocks,
         wherein the constructed data packet is constructed to be processable by ones of the at least one receiving device that are configured to recognize and process the corresponding redundancy blocks and also processable by others of the at least one receiving device that cannot recognize the presence of the corresponding redundancy blocks; and
      send the data packet, via the transceiver, to the at least one receiving device.

2. The device of claim 1, wherein the one or more message blocks are in accordance with an industry standard.

3. The device of claim 1, wherein each determined redundancy block includes:
   a detection redundancy sub-block; and
   a correction redundancy sub-block.

4. The device of claim 1, wherein the constructing of the data packet includes constructing the data packet with the one or more redundancy blocks in the data payload intentionally left empty.

5. The device of claim 1, wherein the instructions further direct the processor to:
   receive, via the transceiver, a redundancy request from one of the at least one receiving device sent by the receiving device in response to the receiving device receiving the data packet;
   construct a redundancy packet in response to the redundancy request, the redundancy packet including:
      a redundancy header; and
      a redundancy payload including at least one of the one or more redundancy blocks; and
   send the redundancy packet to the requesting receiving device.

6. The device of claim 5, wherein the redundancy request includes an identification of the one or more message blocks for which corresponding redundancy blocks are needed; and wherein the redundancy payload includes the determined redundancy blocks corresponding to the identified message blocks.

7. The device of claim 5, wherein the redundancy request includes communication condition information from the perspective of the requesting receiving device, and wherein the instructions further direct the processor to alter communication parameters used to send subsequent data packets and redundancy packets based on the received communication condition information.

8. The device of claim 7, wherein the communication condition information includes one or more of received signal strength, signal-to-noise ratio, noise time profile, modulation information, data rate information, or history of previous transmission failures.

9. The device of claim 7, wherein the communication parameters include one or more of size of message blocks, size of correction blocks, amount of redundancy, modulation type, modulation rate, or data rate.

10. The device of claim 5, wherein the instructions further direct the processor to:
    receive and process additional redundancy requests from the requesting receiving device up to a predetermined threshold amount of redundancy requests.

11. A method of sending communications with dynamic data correction from a sending device to at least one receiving device, the method comprising:
    dividing, by a processor of the sending device, a message into one or more message blocks;
    determining, by the processor, corresponding redundancy blocks for the one or more message blocks, the redundancy blocks to be used by at least one of the at least one receiving device for at least one of message block detection or message block correction;

constructing a data packet, the data packet including:
a header; and
a data payload, the data payload including the one or more message blocks and the corresponding redundancy blocks,
wherein the constructed data packet is constructed to be processable by ones of the at least one receiving device that are configured to recognize and process the corresponding redundancy blocks and also processable by others of the at least one receiving device that cannot recognize the presence of the corresponding redundancy blocks; and
sending the data packet, via a transceiver of the sending device, to the at least one receiving device.

12. The method of claim 11, wherein the one or more message blocks are in accordance with an industry standard.

13. The method of claim 11, wherein the determining of each of the redundancy blocks includes:
determining a detection redundancy sub-block; and
determining a correction redundancy sub-block.

14. The method of claim 11, wherein the constructing the data packet includes intentionally leaving the redundancy blocks empty in the data payload.

15. The method of claim 11, further comprising:
receiving, via the transceiver, a redundancy request from one of the at least one receiving device sent by the receiving device in response to the receiving device receiving the data packet;
constructing a redundancy packet in response to the redundancy request, the redundancy packet including:
a redundancy header; and
a redundancy payload including at least one of the one or more redundancy blocks; and
sending the redundancy packet to the requesting receiving device.

16. The method of claim 15, wherein the redundancy request includes an identification of the one or more message blocks for which corresponding redundancy blocks are needed; and wherein the redundancy payload includes the redundancy blocks corresponding to the identified message blocks.

17. At least one non-transitory computer-readable medium having computer program logic stored thereon, the computer program logic including instructions that, when executed by a processor of a communications device, cause the processor to:
divide a message into one or more message blocks;
determine corresponding redundancy blocks for the one or more message blocks, the redundancy blocks to be used by at least one receiving device for at least one of message block detection or message block correction;
construct a data packet, the data packet including:
a header; and
a data payload, the data payload including the one or more message blocks and the corresponding redundancy blocks,
wherein the constructed data packet is constructed to be processable by ones of the at least one receiving device that are configured to recognize and process the corresponding redundancy blocks and also processable by others of the at least one receiving device that cannot recognize the presence of the corresponding redundancy blocks; and
send the data packet, via a transceiver of the communications device, to the at least one receiving device.

18. The non-transitory computer-readable medium of claim 17, wherein the one or more message blocks are in accordance with an industry standard.

19. The non-transitory computer-readable medium of claim 17, wherein the determining of each of the redundancy blocks includes:
determining a detection redundancy sub-block; and
determining a correction redundancy sub-block.

20. The non-transitory computer-readable medium of claim 17, wherein the constructing the data packet includes intentionally leaving the redundancy blocks empty in the data payload.

21. The non-transitory computer-readable medium of claim 17, wherein the instructions further cause the processor to:
receive, via the transceiver, a redundancy request from one of the at least one receiving device sent by the receiving device in response to the receiving device receiving the data packet;
construct a redundancy packet in response to the redundancy request, the redundancy packet including:
a redundancy header; and
a redundancy payload including at least one of the one or more redundancy blocks; and
send the redundancy packet to the requesting receiving device.

22. The non-transitory computer-readable medium of claim 21, wherein the redundancy request includes an identification of the one or more message blocks for which corresponding redundancy blocks are needed; and wherein the redundancy payload includes the redundancy blocks corresponding to the identified message blocks.

* * * * *